US010998695B2

United States Patent
Kawakami et al.

(10) Patent No.: US 10,998,695 B2
(45) Date of Patent: May 4, 2021

(54) SEMICONDUCTOR LASER DEVICE, MANUFACTURING METHOD THEREOF, AND LIGHT EMITTING DEVICE

(71) Applicant: SHARP KABUSHIKI KAISHA, Sakai (JP)

(72) Inventors: Toshiyuki Kawakami, Sakai (JP); Masayuki Ohta, Sakai (JP); Ryota Kawamura, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 169 days.

(21) Appl. No.: 16/237,323

(22) Filed: Dec. 31, 2018

(65) Prior Publication Data
US 2019/0221999 A1 Jul. 18, 2019

(30) Foreign Application Priority Data

Jan. 18, 2018 (JP) .............................. JP2018-006496

(51) Int. Cl.
| H01S 5/028 | (2006.01) |
| H01S 5/10 | (2021.01) |
| H01S 5/22 | (2006.01) |
| H01S 5/24 | (2006.01) |
| H01S 5/042 | (2006.01) |
| H01S 5/40 | (2006.01) |
| H01S 5/02 | (2006.01) |
| H01S 5/02216 | (2021.01) |
| H01S 5/16 | (2006.01) |
| H01S 5/02253 | (2021.01) |

(52) U.S. Cl.
CPC .......... *H01S 5/1003* (2013.01); *H01S 5/0286* (2013.01); *H01S 5/04254* (2019.08); *H01S 5/1025* (2013.01); *H01S 5/1039* (2013.01); *H01S 5/1082* (2013.01); *H01S 5/2202* (2013.01); *H01S 5/24* (2013.01); *H01S 5/0202* (2013.01); *H01S 5/0282* (2013.01); *H01S 5/0287* (2013.01); *H01S 5/02216* (2013.01); *H01S 5/02253* (2021.01); *H01S 5/162* (2013.01); *H01S 5/22* (2013.01); *H01S 5/4031* (2013.01); *H01S 2301/176* (2013.01)

(58) Field of Classification Search
CPC ....... H01S 5/0286; H01S 5/0287; H01S 5/162
See application file for complete search history.

(56) References Cited

U.S. PATENT DOCUMENTS

| 4,845,725 A * | 7/1989 | Welch ...................... H01S 5/162 372/46.016 |
| 2004/0233950 A1 | 11/2004 | Furukawa et al. |
| 2007/0104242 A1* | 5/2007 | Kudo ...................... H01S 5/227 372/96 |

FOREIGN PATENT DOCUMENTS

| CN | 1509508 A | 6/2004 |
| CN | 1527450 A | 9/2004 |

(Continued)

*Primary Examiner* — Michael Carter
(74) *Attorney, Agent, or Firm* — ScienBiziP, P.C.

(57) ABSTRACT

A semiconductor laser device includes an optical waveguide that extends toward a first end of the semiconductor laser device. The optical waveguide includes a first clad layer, an active layer, a second clad layer, and an electrode layer in this order. A reflecting surface, which has a dielectric film and a metal film in this order from the active layer, crosses the active layer at a second end of the optical waveguide.

11 Claims, 21 Drawing Sheets

(56) References Cited

FOREIGN PATENT DOCUMENTS

| | | |
|---|---|---|
| JP | 2000-031579 A | 1/2000 |
| WO | 2005/053124 A1 | 6/2005 |

\* cited by examiner

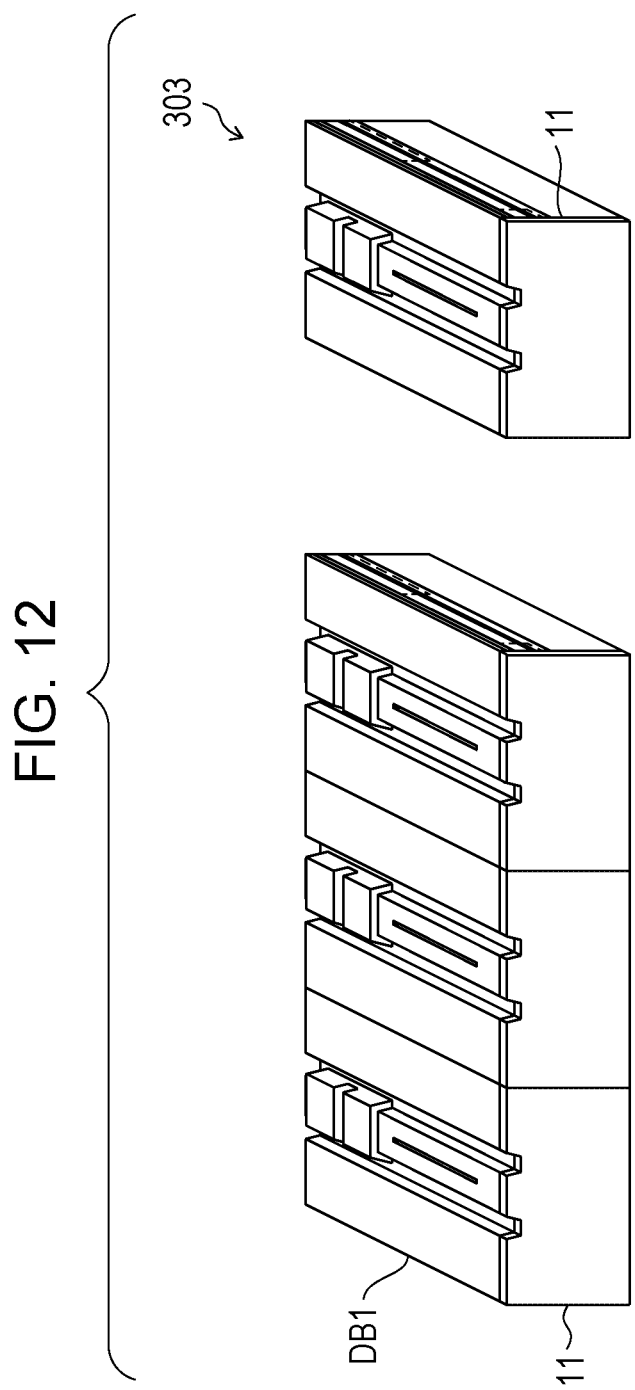

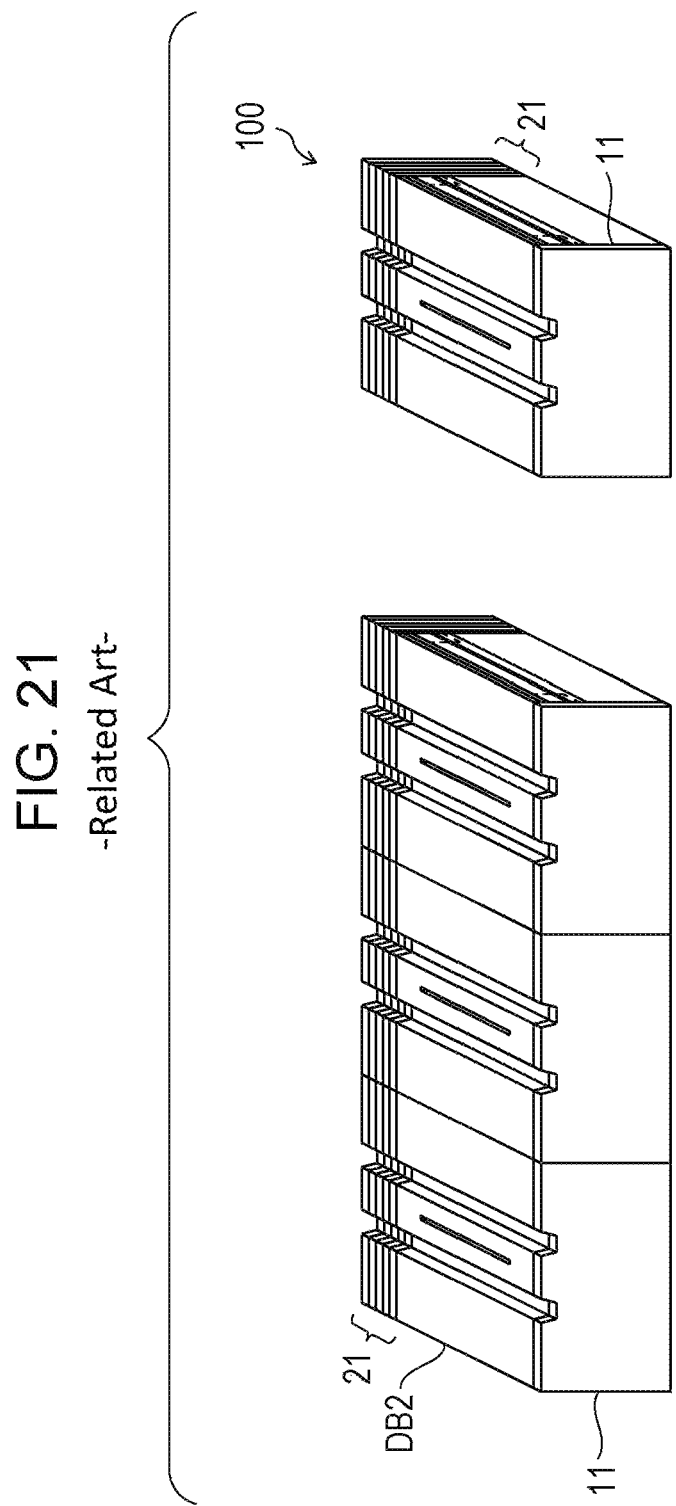

SEMICONDUCTOR LASER DEVICE, MANUFACTURING METHOD THEREOF, AND LIGHT EMITTING DEVICE

BACKGROUND

1. Field

The present disclosure relates to a semiconductor laser device, a manufacturing method thereof, and a light emitting device.

2. Description of the Related Art

It is well known that a semiconductor laser is used for an optical disk. However, the other uses are also known. As the other uses of the semiconductor laser, uses in a vehicle are known. More specifically, a blue laser used for headlight and an infrared laser used for measuring an inter-vehicular distance for automatic driving are known. Further, as the other uses of the semiconductor laser, use as a light source of a display device such as a display and a projector is known. In these other uses, high reliability is desired.

As a semiconductor laser of the related art, it is known that the semiconductor laser has a cleavage surface or an emitting surface which is an etched mirror surface, and Al, W, or a multi-layer insulating layer is attached to a reflecting surface facing the emitting surface through an optical waveguide (for example, see Japanese Unexamined Patent Application Publication No. 2000-031579 (published on Jan. 28, 2000)). Further, as a semiconductor laser of the related art, the semiconductor laser is known where a front end face is cleavage, a rear end face is formed by ICP dry etching or the like, and the rear end face is coated with a metal multilayer film that is the same as a p-side electrode or a dielectric multilayer film (for example, see Domestic Re-publication of PCT International Publication for Patent Application No. 2005/053124 (published on Jun. 9, 2005)).

However, the related arts as described above have a problem from a viewpoint of reliability of the semiconductor laser device. For example, in the art of Japanese Unexamined Patent Application Publication No. 2000-031579, when Al or W is attached to the reflecting surface, the reflecting surface may be a leak path, and therefore the reliability of the semiconductor laser device may be degraded. When the reflecting surface is formed by a multilayer insulating film, dust caused from insulator which is material of the multilayer insulating film may attach to the semiconductor laser device, and thus the reliability of the semiconductor laser device may be degraded.

In the art of Domestic Re-publication of PCT International Publication for Patent Application No. 2005/053124, when the rear end face is coated with a metal multilayer film that is the same as a p-side electrode, the rear end face may be a leak path, and therefore the reliability of the semiconductor laser device may be degraded. When the rear end face is formed by a dielectric multilayer film, dust caused from insulator which is material of the dielectric multilayer film may attach to the semiconductor laser device, and therefore the reliability of the semiconductor laser device may be degraded. Thus, there is room for examination in the related arts from a viewpoint of suppressing contamination of a product caused from manufacturing process.

It is desirable to provide a semiconductor laser device having high reliability and capable of sufficiently suppressing the contamination caused from the manufacturing process.

SUMMARY

According to a first aspect of the disclosure, there is provided a semiconductor laser device including a first clad layer, an active layer, a second clad layer, and an electrode layer in this order. The semiconductor laser device further includes an optical waveguide that extends from inside of an end face of a second end of the semiconductor laser device toward an end face of a first end of the semiconductor laser device, and a reflecting surface which is arranged at an end on a second end side of the optical waveguide and which crosses the active layer. The reflecting surface has a dielectric film and a metal film in this order from the active layer.

According to a second aspect of the disclosure, there is provided a manufacturing method of a semiconductor laser device. The manufacturing method includes forming a portion to be an optical waveguide extending from a first end to a second end of a substrate in a second clad layer of a device material having a first clad layer, an active layer, and the second clad layer in this order on the substrate, forming a recessed portion which opens in the second clad layer and crosses the active layer in an end portion on a second end side in the portion to be the optical waveguide, forming a dielectric film that covers a portion where the active layer on a first end side in a side face of the recessed portion is exposed, forming a metal film that covers the dielectric film, and forming an electrode layer on the second clad layer in the portion to be the optical waveguide.

According to a third aspect of the disclosure, there is provided a light emitting device including the semiconductor laser device according to the first aspect.

BRIEF DESCRIPTION OF THE DRAWINGS

FIG. 12 is a perspective view schematically showing a product of a twelfth step in the manufacturing process of the semiconductor laser device according to the embodiment of the present disclosure;

FIG. 21 is a perspective view schematically showing a product of an eighth step in the manufacturing process of the semiconductor laser device of the related art of the present disclosure.

DESCRIPTION OF THE EMBODIMENTS

[Configuration of Semiconductor Laser Device]

Figure 1A:
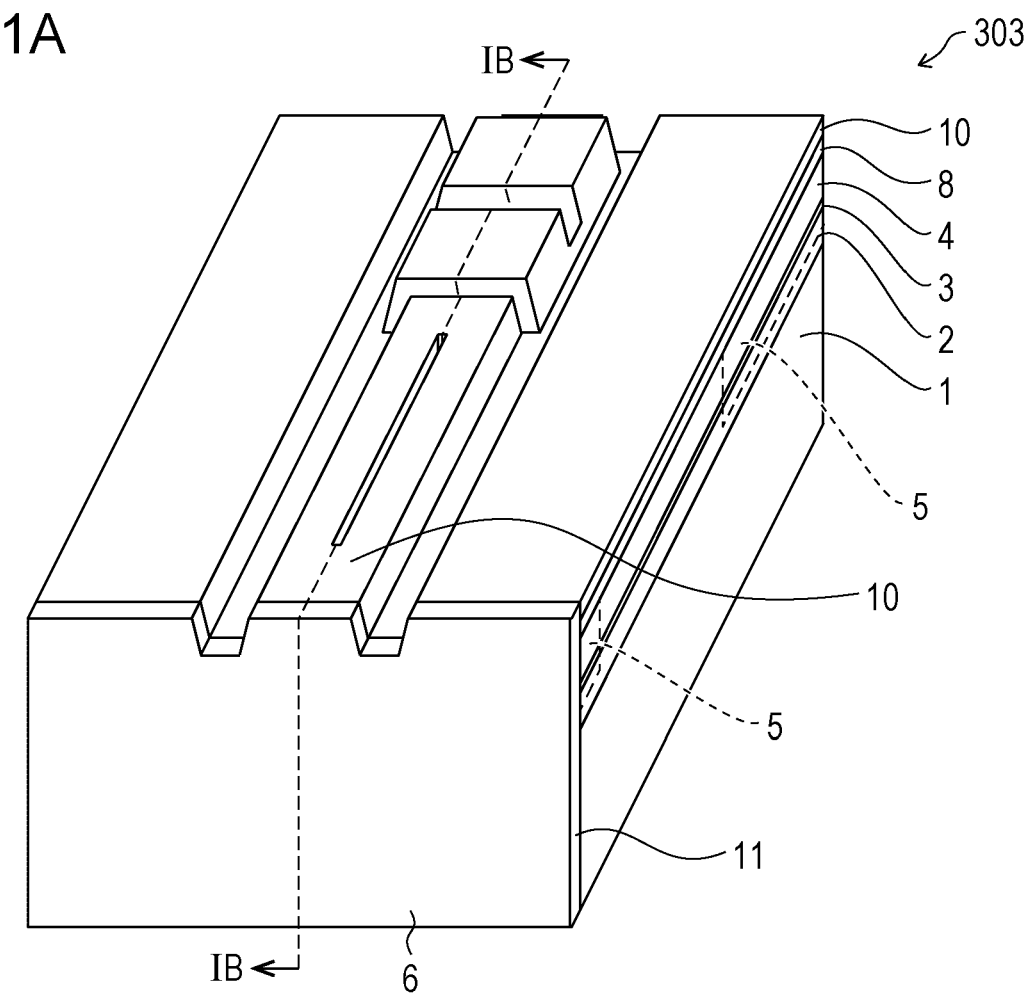
FIG. 1A is a perspective view schematically showing a configuration of a semiconductor laser device according to an embodiment of the present disclosure.
Figure 1B:
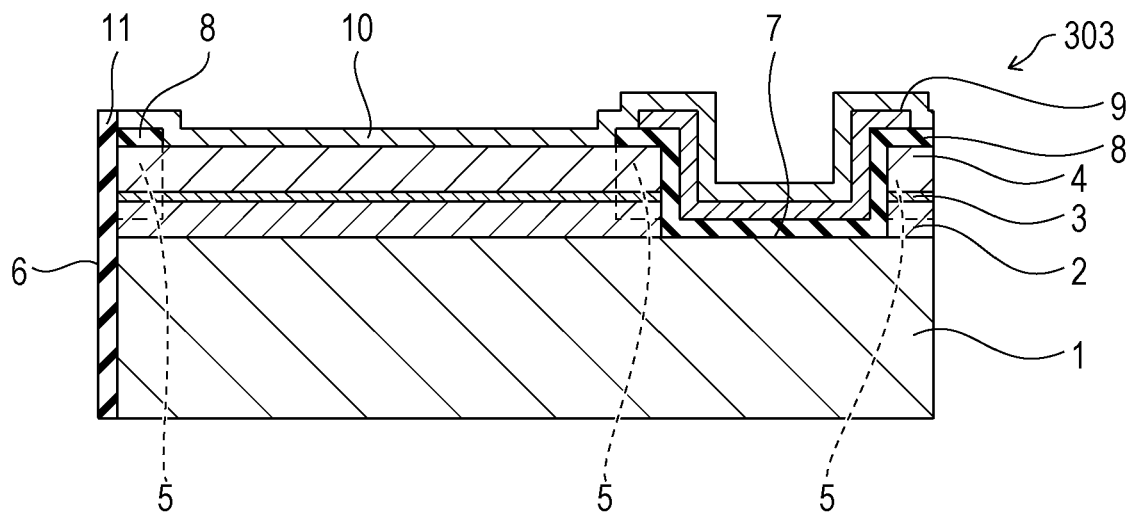
FIG. 1B is a diagram schematically showing a structure of a section of the semiconductor laser device taken along line IB-IB in FIG. 1A.

Hereinafter, an embodiment of the present disclosure will be described in detail. A semiconductor laser device according to the embodiment of the present disclosure can be configured in the same manner as a known semiconductor laser device other than a configuration related to a reflecting surface described later. FIG. 1A is a perspective view schematically showing a configuration of the semiconductor laser device according to the embodiment of the present disclosure. FIG. 1B is a diagram schematically showing a structure of a section of the semiconductor laser device taken along line IB-IB in FIG. 1A.

As shown in FIGS. 1A and 1B, a semiconductor laser device 303 includes a first clad layer 2, an active layer 3, a second clad layer 4, and an electrode layer 10 in this order on a substrate 1. The substrate 1 may be a known substrate used to support a laser device structure. For example, the substrate 1 is an n-type GaAs substrate.

The active layer 3 has a quantum well layer. Crystals forming the active layer 3 can be determined according to crystals used for the quantum well layer. Further, the crystals forming the active layer 3 can also be appropriately determined according to use of the semiconductor laser device. Examples of the crystals that form the active layer 3 include AlGaAs, GaAs, and GaInP.

The first clad layer 2 and the second clad layer 4 are composed of crystal material having an action of confining generated light in the active layer 3. For example, when the generated laser light is infrared laser or red laser, examples of the crystal material of the first clad layer land the second clad layer 4 include AlGaInP. An upper surface of the second clad layer 4 has two grooves (denoted by symbol 4A described later) along a longitudinal direction of the semiconductor laser device 303 and a protruded portion (denoted by symbol 4B described later) located between the two grooves.

The electrode layer 10 is arranged so as to cover an upper surface of the semiconductor laser device 303. The electrode layer 10 is in contact with the second clad layer 4 at a central portion of the protruded portion of the second clad layer 4 on the upper surface along the longitudinal direction and is in contact with a dielectric film 8 on the other portion of the upper surface. The electrode layer 10 is a p-side electrode. The whole electrode layer 10 only need to have sufficient conductivity in a lamination direction and is composed of, for example, metal. Examples of the metal as the material of the electrode 10 include Au, Al, and Ag.

A portion including sequentially from the first clad layer 2 to the electrode layer 10 forms an optical waveguide that extends toward one end face 6 of the semiconductor laser device 303. The one end face 6 is an end face of a first end of the semiconductor laser device 303. A range of the optical waveguide in the longitudinal direction of the semiconductor laser device 303 when the semiconductor laser device 303 is seen in plan view is from the one end face 6 to a side face of an after-mentioned recessed portion 7 facing the one end face 6. A range of the optical waveguide in a short direction of the semiconductor laser device 303 is a width of a high refractive index region formed in the second clad layer 4 and the range is the same as a width of a ridge portion in the embodiment.

The electrode layer 10 may be a single layer or may have a laminated structure. The electrode layer 10 of the laminated structure has, for example, an adhesion layer and a protective layer in this order. The adhesion layer is a layer having relatively high adhesiveness with a metal film 9 described later and is composed of, for example, a metal material of the electrode layer 10 described above. The protective layer is a layer for improving chemical and physical resistance of the electrode layer 10. Examples of the metal material of the protective layer include Ti, W, Ta, Nb, Ni, and Pt.

The semiconductor laser device 303 further includes the recessed portion 7 that opens on an upper surface of the second clad layer 4 in this way, the semiconductor laser device 303 has the recessed portion 7 inside an end face of a second end of the semiconductor laser device 303. The second end is an end opposite to the first end described above. The recessed portion 7 reaches from the second clad layer 4 to the surface of the substrate 1 in the depth direction of the recessed portion 7 at the second end of the optical waveguide. In this way, the recessed portion 7 has a depth from the second clad layer 4 to at least the first clad layer 2.

The shape of the recessed portion 7 in plan view is a rectangle. The recessed portion 7 is located on a second end side in a longitudinal direction of the substrate 1. A side face on the second end side in the recessed portion 7 is arranged a predetermined distance away from the end face of the second end of the semiconductor laser device 303.

A length of the recessed portion 7 along the longitudinal direction of the substrate 1 in plan view is, for example, 5 to 20 µm. It is possible to arbitrarily determine a length of the recessed portion 7 along the short direction of the substrate in plan view in a range of about 1 µm to several hundreds µm in consideration of effusion of light from the optical waveguide. For example, it is possible to arbitrarily determine the length of the recessed portion 7 in the short direction from a range between a width of the optical waveguide and the width+100 µm.

The recessed portion 7 includes the dielectric film 8 and the metal film 9 in this order on the surface of the recessed portion 7. The dielectric film 8 covers the surface of the recessed portion 7 and a portion of the protruded portion in the second clad layer 4 other than the central portion of the protruded portion. The dielectric film 8 is composed of material that has sufficient electrical insulation as a film. Examples of the material of the dielectric film 8 include aluminum oxide, silicon oxide, zirconia, silicon nitride, aluminum nitride, gallium nitride, silicon oxynitride, and aluminum oxynitride.

The metal film 9 extends on the surface of the recessed portion 7 and to a peripheral edge portion of an opening portion of the recessed portion 7 in a case where the semiconductor laser device 303 is seen in plan view. For example, the metal film 9 normally extends to a position 0.5 to 1 µm away from an opening end edge of the recessed pardon 7. In this way, the metal film 9 is arranged to extend to over a part of the second clad layer 4 when the semiconductor laser device 303 is seen in plan view. The position to which the metal film 9 extends from the opening end edge can be appropriately determined according to accuracy of photo proccess. The metal film 9 extends to a position between the recessed portion 7 in the second clad layer 4 and an outer edge of the semiconductor laser device 303 when the semiconductor laser device 303 is seen in plan view. The electrode layer 10 is located also on the metal film 9.

The side face of the recessed portion 7 facing the one end face 6 is a flat surface crossing the active layer 3 at the second end of the optical waveguide and has the dielectric film 8 and the metal film 9 in this order from the active layer 3. In this way, the side face constitutes a reflecting surface crossing the active layer 3. The reflecting surface is located closer to the first end side of the semiconductor laser device 303 than the end face of the second end. In this way, the semiconductor laser device 303 has the reflecting surface inside the end face of the second end (at a position closer to the one end face 6 than the end face of the second end).

The side face of the recessed portion 7 is substantially in parallel with the one end face 6 which is a laser light emitting surface of the semiconductor laser device 303. Here, "substantially in parallel with" means that the reflecting surface is in a direction where the semiconductor laser device 303 sufficiently realizes a desired output of the laser light. For example, the side face is located in an orientation where an angle between the side surface and the one end face 6 is 10° or less. The angle between the side surface and the one end face 6 is preferable to be 2° or less from a viewpoint of increasing the output of laser light (suppressing lowering rate of reflection ratio to 20% or less), and it is more preferable that the side surface and the one end face 6 are in parallel with each other.

The semiconductor laser device 303 has the one end face 6. The one end face 6 is the end on the first end side of the optical waveguide and is the laser light emitting surface as described above. The one end face 6 is a cleavage surface formed by cleaving an aggregate of crystals that constitute the semiconductor laser device. The reflecting surface described above is the end on the second end side of the optical waveguide.

The one end face 6 is covered by an end face coat film 11. The end face coat film 11 is a film made of dielectric (dielectric film) that covers the end face of the first end of the semiconductor laser device 303. The end face coat film 11 is arranged from viewpoints of protecting the end face of the semiconductor laser device 303 and controlling the reflection ratio of the end face. For example, the end face coat film 11 is formed so that the reflection ratio of the generated laser light at the emitting surface is lower than that at the reflecting surface. The reflection ratios of the laser light at the emitting surface and the reflecting surface can be appropriately determined according to, for example, a desired performance of the semiconductor laser device.

Examples of the dielectric that forms the end face coat film 11 include the examples of the dielectric shown in the description of the dielectric film 8. The dielectric that forms the end face coat film 11 may be the same as or different from the dielectric that forms the dielectric film 8.

The semiconductor laser device 303 further includes window regions 5. The window regions 5 are regions which are located at both end portions of the optical waveguide and which absorb the laser light less than a central portion of the optical waveguide. The window region 5 is also arranged between the end face of the second end and the recessed portion 7 of the semiconductor laser device 303 in addition to at both end portions of the optical waveguide. The window region 5 is a portion for inhibiting the laser from being degraded by dissolution of the end face of the optical waveguide due to heat generated by absorption of laser light it is preferable for the window region 5 to be a region that absorbs substantially no laser light from a viewpoint of inhibiting the laser from being degraded.

Here, it can be said that the semiconductor laser device 303 has a laminated structure body where the first clad layer 2, the active layer 3, and the second clad layer 4 are laminated in this order on a first surface of the substrate 1 of a semiconductor having the first surface and a second surface and has an optical waveguide structure in the laminated structure. Further, it can also be said that a first mirror (the one end face 6) and a second mirror (the reflecting surface) are arranged substantially in parallel with each other at both ends of the optical waveguide structure.

The first mirror described above is substantially flat over an area from an upper surface of the laminated body structure to a second surface of the substrate 1. The second mirror described above is formed on one surface of the recessed portion 7 starting from the upper surface of the laminated body structure and reaching at least the first clad layer 2 through the second clad layer 4.

The recessed portion 7 has a side face (opposite surface) opposite to the second mirror, and the opposite surface is arranged at a position away from the end face of the second end of the semiconductor laser device 303. The side face of the recessed portion 7 on a first mirror side is covered by the dielectric film 8, and the dielectric film 8 is covered by the metal film 9. In this way, the second mirror is formed by laminating the dielectric film 8 and the metal film 9 in this order from the active layer 3. The reflection ratio of the laser light of the first mirror is lower than that of the second mirror.

It is preferable that the semiconductor laser device 303 has the window region 5, whose absorption rate of the laser light from the active layer 3 is lower than that of a central portion of the optical waveguide structure, at both ends of the optical waveguide structure. It is more preferable that the first mirror and the second mirror are arranged in the window regions 5.

In a thickness direction of the semiconductor laser device 303, the deepness of the recessed portion 7 and the thickness of the optical waveguide structure can be smaller than the thickness of the semiconductor laser device 303.

The metal film 9 is formed over an area from at least the side face of the recessed portion 7 to the upper surface of the laminated structure body. The metal film 9 is arranged at a position away from the end face of the second end toward the first end in the semiconductor laser device 303.

The semiconductor laser device 303 includes the electrode layer 10, which is a conductive layer, covers the recessed portion 7 including the second mirror surface, and further covers the metal layer 9 on the second mirror surface. The electrode layer 10 has a larger width than that of the metal film 9 in a short direction of the semiconductor laser device 303 in plan view. The electrode layer 10 can be formed with at least a two-layer structure including an adhesion layer and a protective layer (protective layer/adhesion layer). The electrode layer 10 can double as the electrode layer 10 for injecting carriers into the optical waveguide structure.

[Manufacturing Method of Semiconductor Laser Device]

The semiconductor laser device 303 can be manufactured by the same manufacturing method as that for a known semiconductor laser device except for steps related to manufacturing the reflecting surface. For example, the semiconductor laser device 303 can be manufactured by the following method.

Figure 2A:
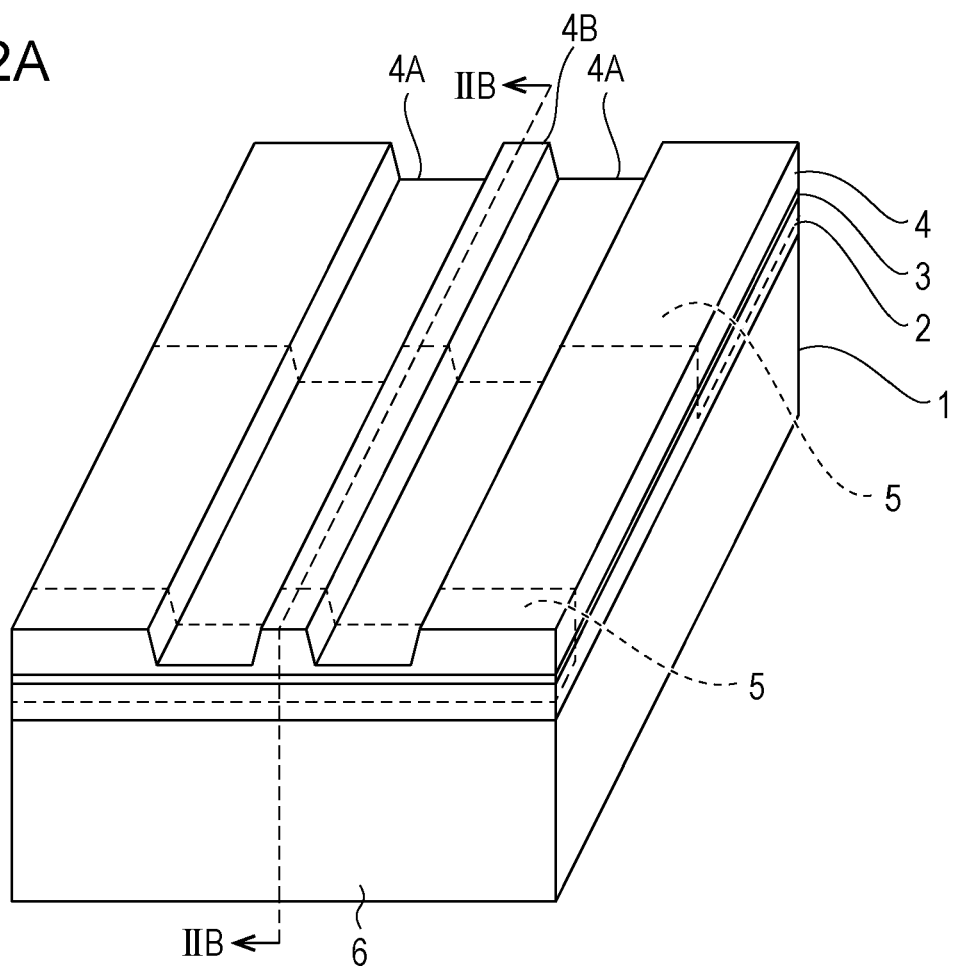
FIG. 2A is a perspective view schematically showing a product of a first step in a manufacturing process of the semiconductor laser device according to the embodiment of the present disclosure.
Figure 2B:
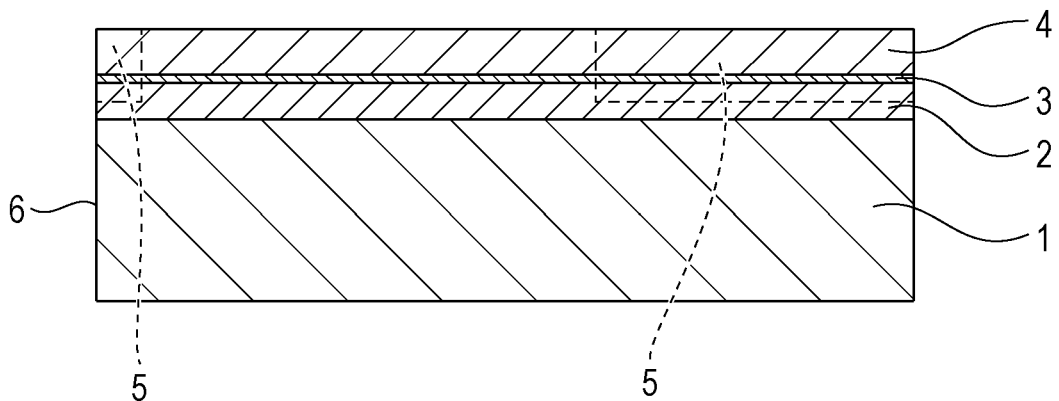
FIG. 2B is a diagram schematically showing a structure of a section of the product taken along line in FIG. 2A.

The manufacturing method includes a step (optical waveguide forming step) of forming a portion to be the optical waveguide extending from the first end to the second end of the substrate 1 in the second clad layer 4 of an device material having the first clad layer 2, the active layer 3, and the second clad layer 4 in this order on the substrate 1. This step can be performed by, for example, a first step described below. FIG. 2A is a perspective view schematically showing a product of the first step in a manufacturing process of the semiconductor laser device 303. FIG. 2B is a diagram schematically showing a structure of a section of the product taken along line IIB-IIB in FIG. 2A.

For example, a large number of the device materials are formed on one wafer. In each device material, the window regions 5, which absorb less laser light than a central portion of the optical waveguide, are formed at both end portions of a portion to be the optical waveguide. The window region 5 can be manufactured by a known method. For example, the window region 5 is manufactured by diffusing zinc (Zn) from a surface of the crystals of the second clad layer 4.

The device material has a so-called air ridge structure. In the optical waveguide forming step (first step), two parallel grooves 4A extending from the first end to the second end of the substrate 1 are formed in the second clad layer 4. The portion to be the optical waveguide is included in the protruded portion 4B located between the two grooves 4A when the semiconductor laser device is seen in plan view. The grooves 4A are formed by a known method such as photolithography. In this way, a wafer where the protruded portion 4B (also referred to as "laser ridge" or "ridge") and the window regions are formed is manufactured.

Figure 3A:
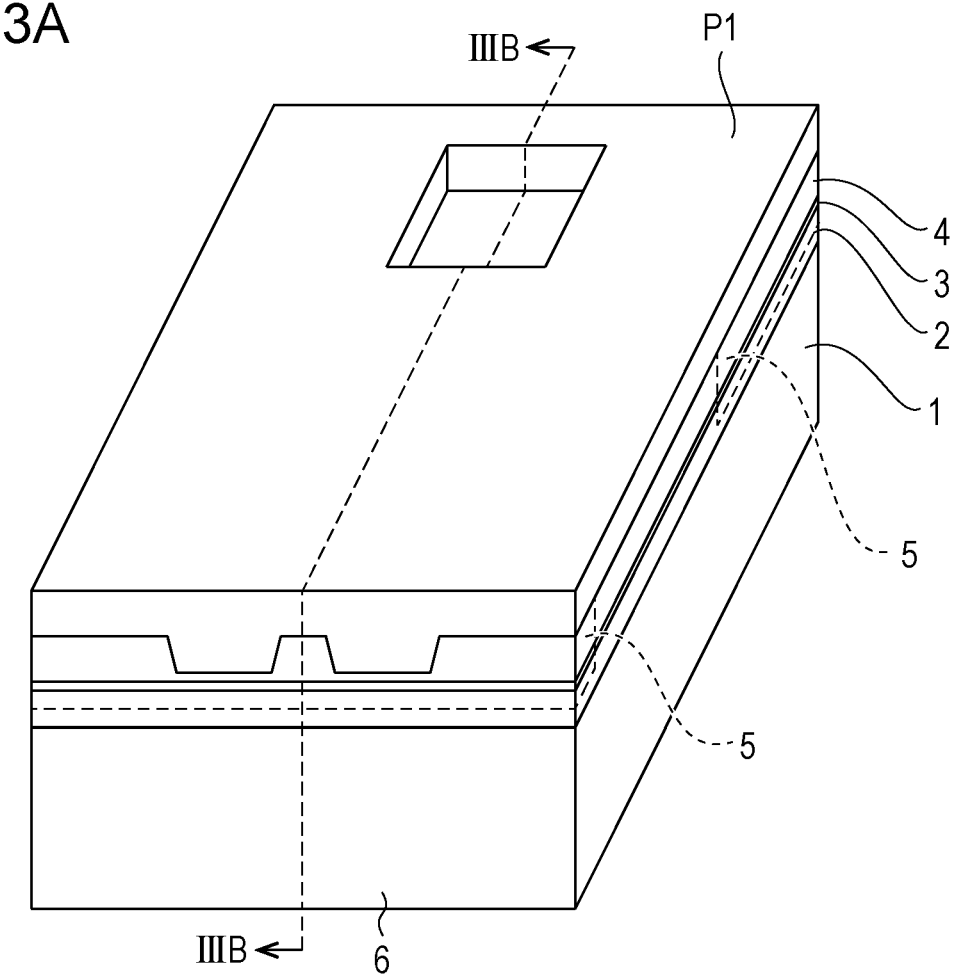
FIG. 3A is a perspective view schematically showing a product of a second step in the manufacturing process of the semiconductor laser device according to the embodiment of the present disclosure.
Figure 3B:
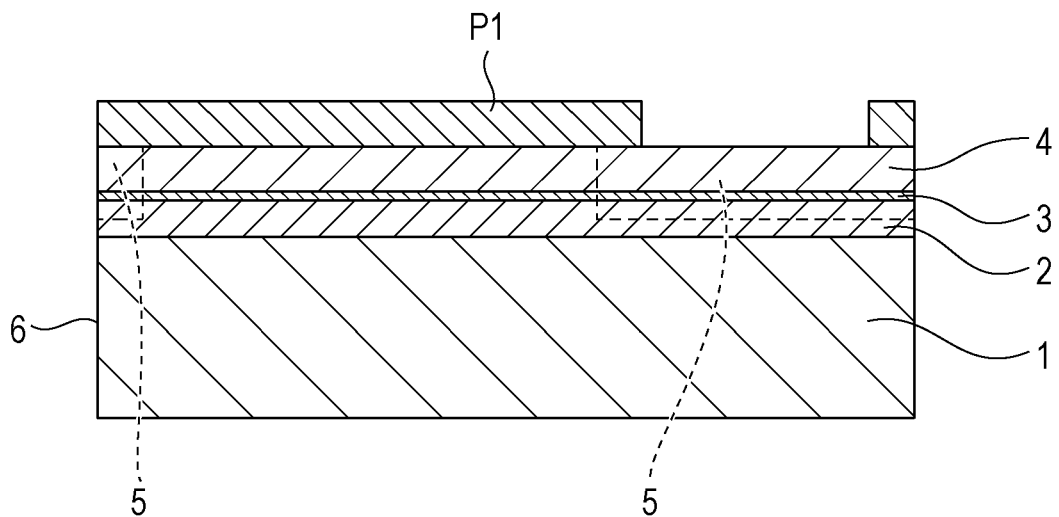
FIG. 3B is a diagram schematically showing a structure of a section of the product taken along line in FIG. 3A.
Figure 4A:
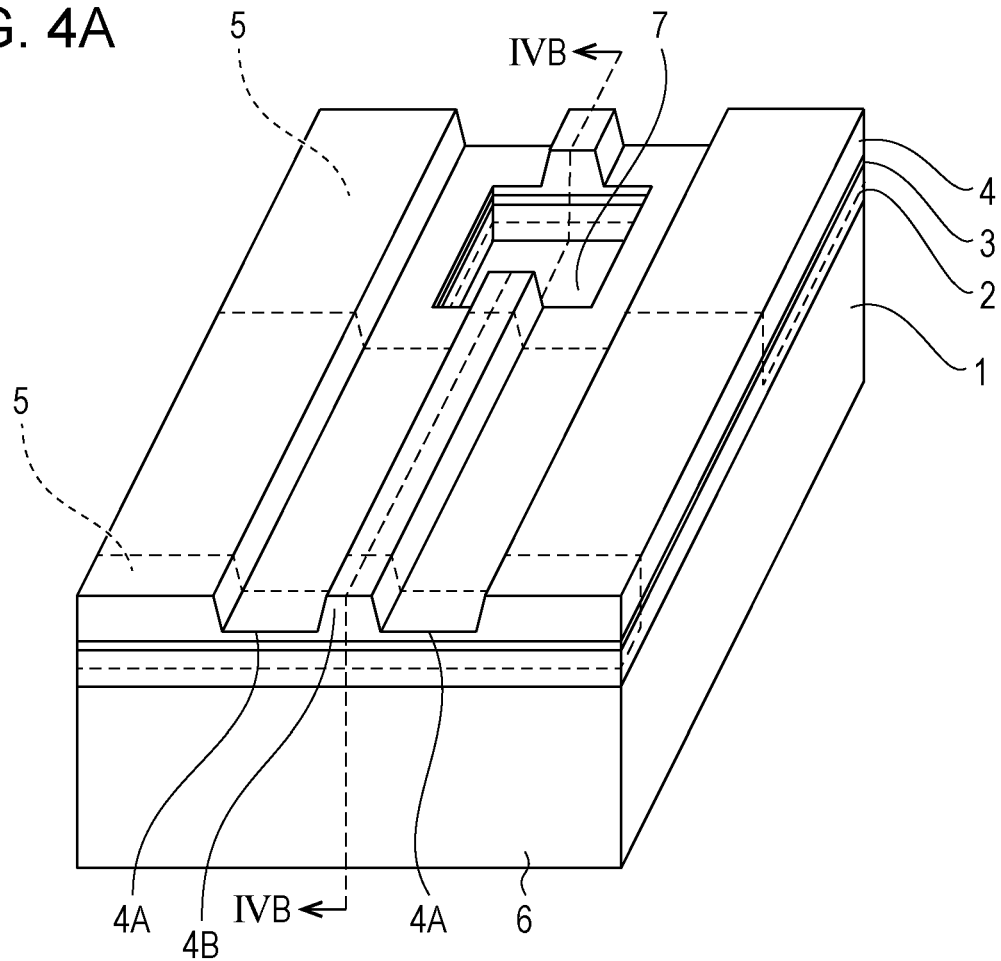
FIG. 4A is a perspective view schematically showing a product of a third step in the manufacturing process of the semiconductor laser device according to the embodiment of the present disclosure.
Figure 4B:
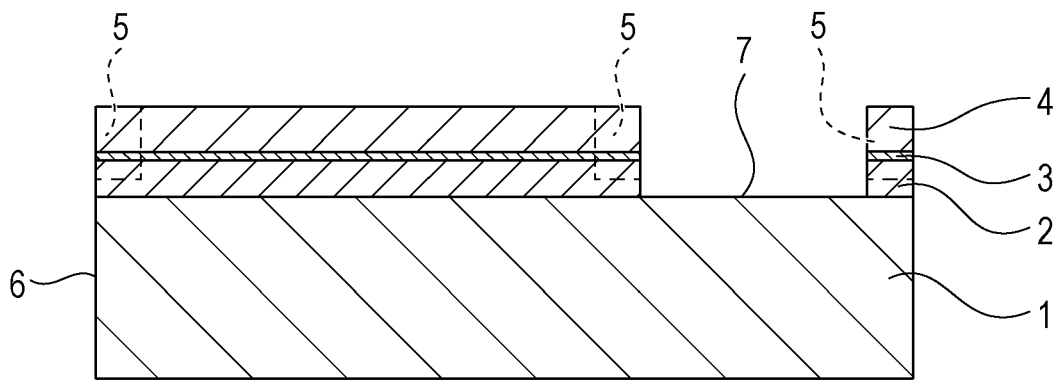
FIG. 4B is a diagram schematically showing a structure of a section of the product taken along line IVB-IVB §a FIG. 4A.

The manufacturing method further includes forming the recessed portion 7 reaching at least from the second clad layer 4 to the first clad layer 2 in the depth direction of the optical waveguide at the end portion on the second end side in the portion to be the optical waveguide. This step can be performed by, for example, a second step and a third step described below FIG. 3A is a perspective view schematically showing a product of the second step in the manufacturing process of the semiconductor laser device 303. FIG. 3B is a diagram schematically showing a structure of a section of the product taken along line IIIB-IIIB in FIG. 3A. FIG. 4A is a perspective view schematically showing a product of the third step in the manufacturing process of the semiconductor laser device 303. FIG. 4B is a diagram schematically showing a structure of a section of the product taken along line IVB-IVB in FIG. 4A.

For example, the forming the recessed portion is forming the recessed portion 7 having a depth of traversing the active layer 3 in a thickness direction of the substrate 1, for example, the recessed portion 7 reaching from the second clad layer 4 to the substrate 1. First, in the second step, a patterning P1 that masks portions not to be etched is formed on the second clad layer 4. Next, in the third step, pattern etching is performed by dry etching, and the recessed portion 7 reaching the surface of the substrate 1 is formed by etching. Next, in a fourth step, the patterning P1 is removed.

Figure 5A:
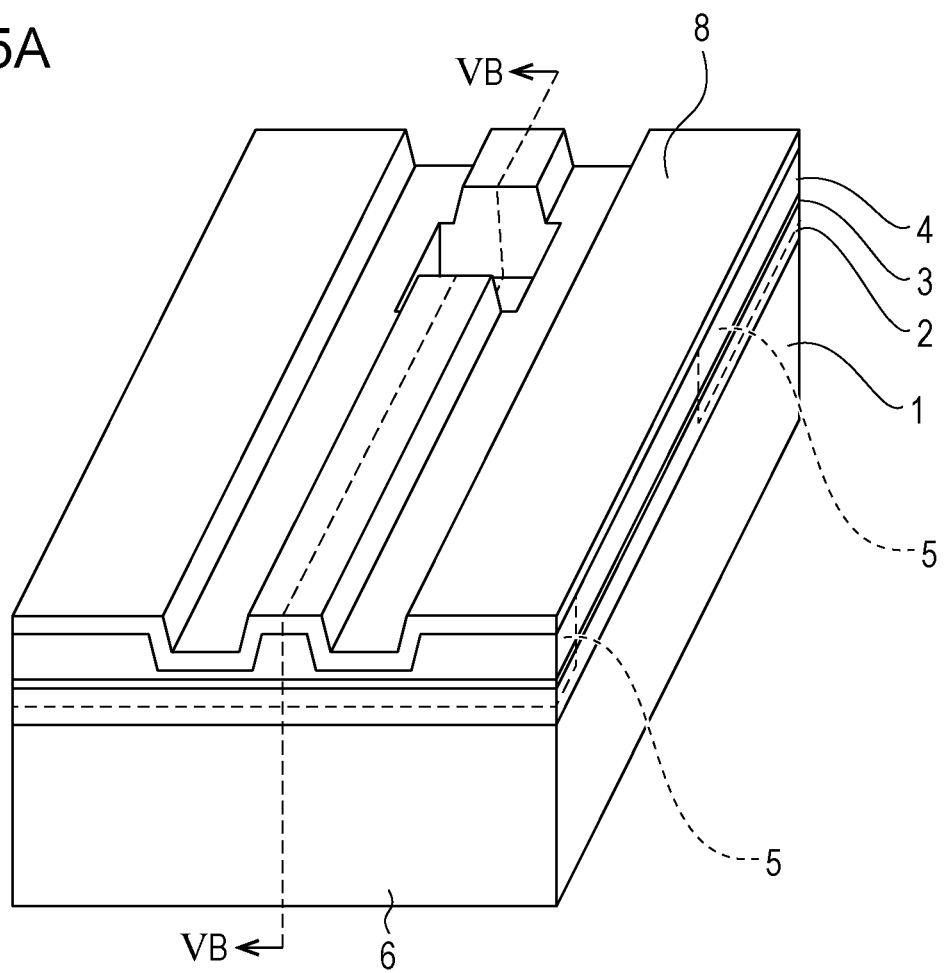
FIG. 5A is a perspective view schematically showing a product of a fourth step in the manufacturing process of the semiconductor laser device according to the embodiment of the present disclosure.
Figure 5B:
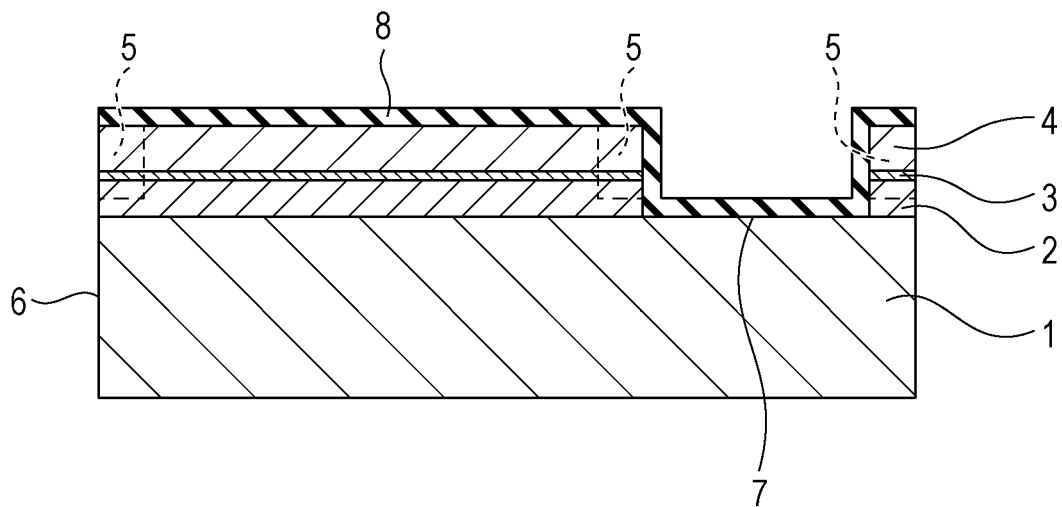
FIG. 5B is a diagram schematically showing a structure of a section of the product taken along line VB-VB in FIG. 5A.
Figure 6A:
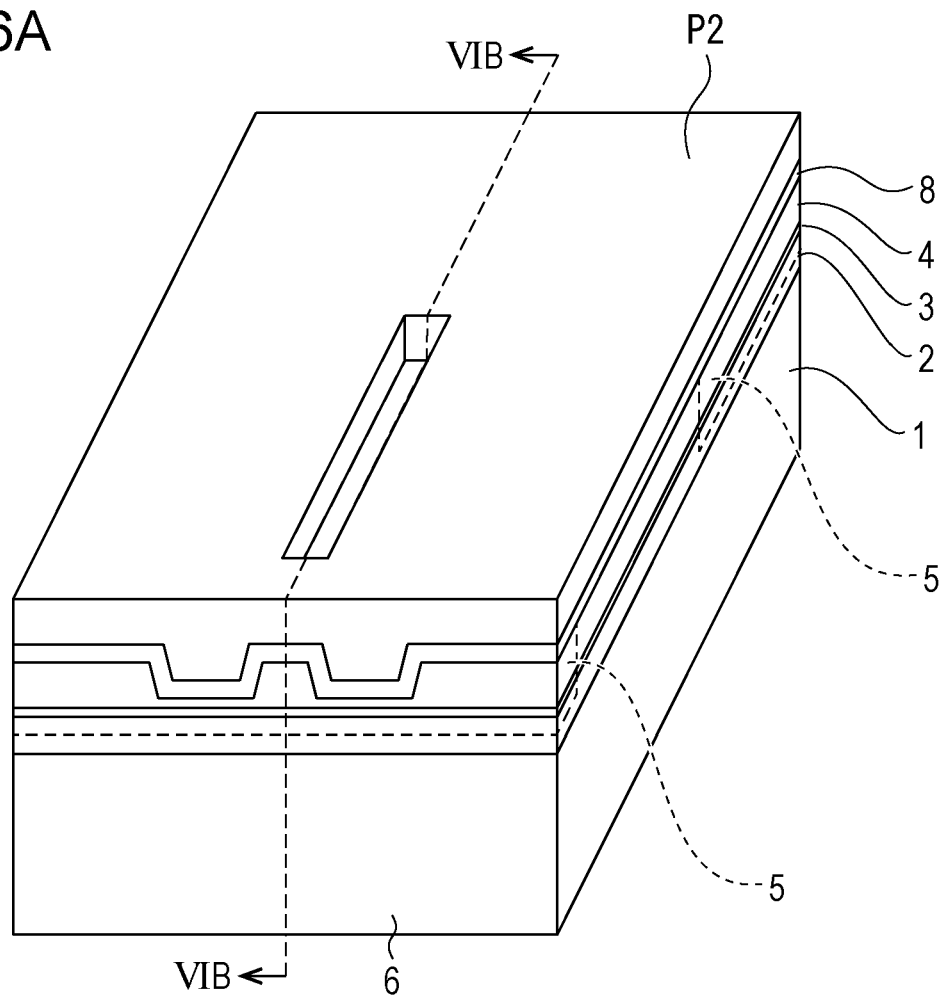
FIG. 6A is a perspective view schematically showing a product of a fifth step in the manufacturing process of the semiconductor laser device according to the embodiment of the present disclosure.
Figure 6B:
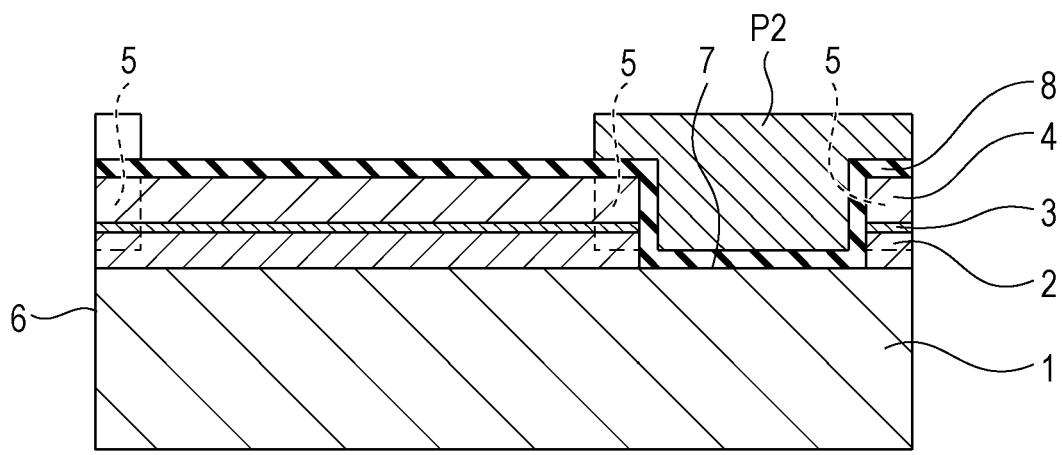
FIG. 6B is a diagram schematically showing a structure of a section of the product taken along line VIB-VIB in FIG. 6A.
Figure 7A:
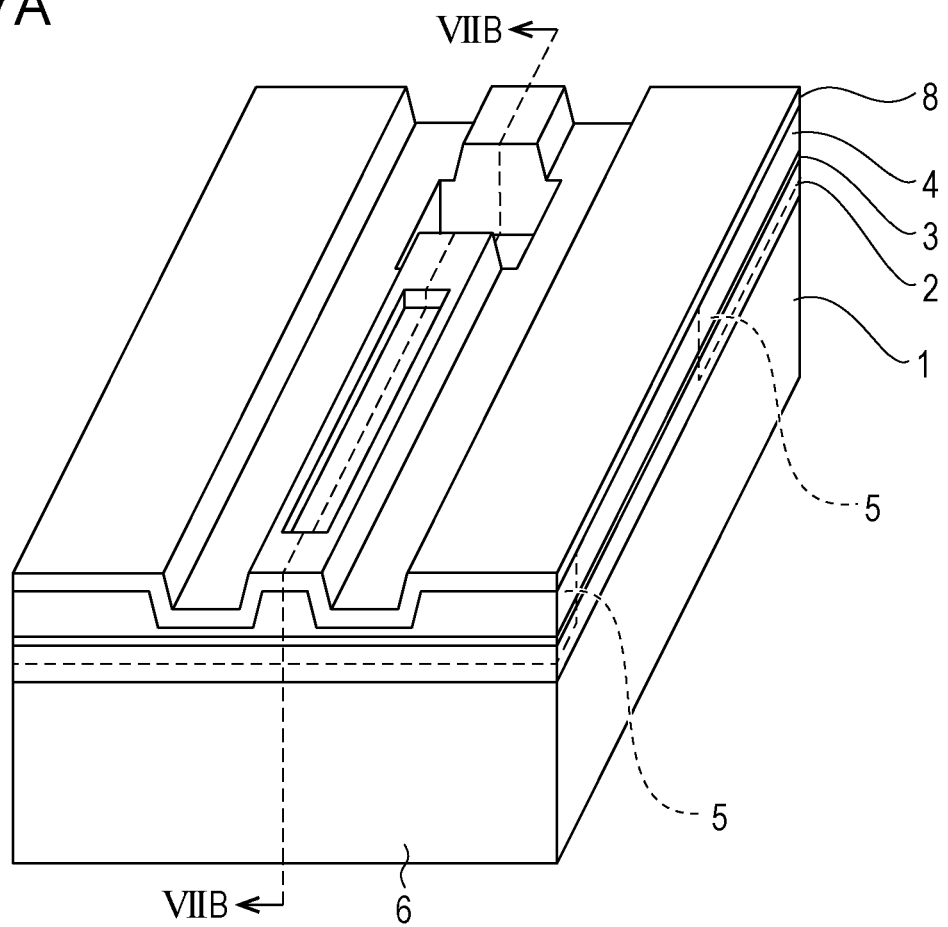
FIG. 7A is a perspective view schematically showing a product of a sixth step in the manufacturing process of the semiconductor laser device according to the embodiment of the present disclosure.
Figure 7B:
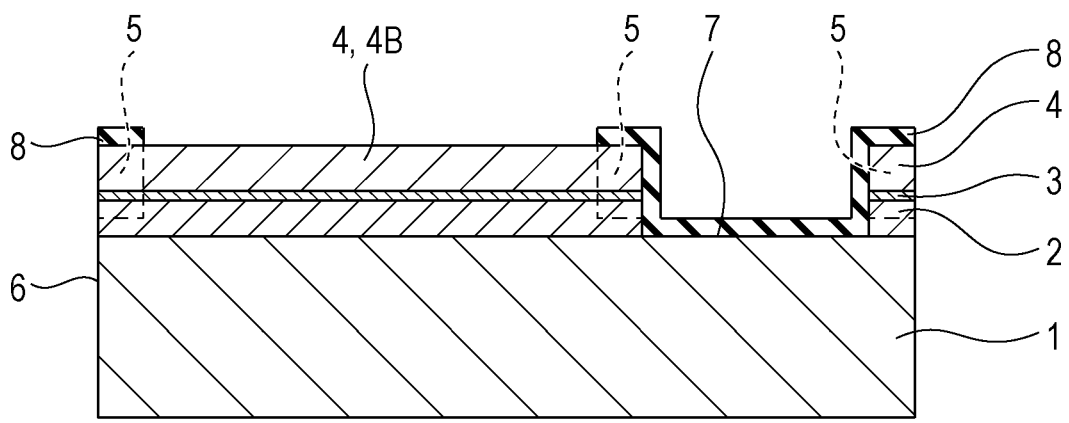
FIG. 7B is a diagram schematically showing a structure of a section of the product taken along line VIIB-VIIB in FIG. 7A.

The manufacturing method further includes forming the dielectric film 8 that covers a portion where the active layer 3 on the first end side in a side face of the recessed portion 7 is exposed. This step can be performed by, for example, a fourth step, a fifth step, and a sixth step described below. FIG. 5A is a perspective view schematically showing a product of the fourth step in the manufacturing process of the semiconductor laser device 303. FIG. 5B is a diagram schematically showing a structure of a section of the product taken along line VB-VB in FIG. 5A. FIG. 6A is a perspective view schematically snowing a product of the fifth step in the manufacturing process of the semiconductor laser device 303. FIG. 6B is a diagram schematically showing a structure of a section of the product taken along line VIB-VIB in FIG. 6A. FIG. 7A is a perspective view schematically showing a product of the sixth step in the manufacturing process of the semiconductor laser device 303. FIG. 7B is a diagram schematically showing a structure of a section of the product taken along line VIIB-VIIB in FIG. 7A.

The forming the dielectric, film is, for example, forming the dielectric film 8 that covers the surface of the recessed portion 7. First, in the fourth step, the dielectric film 8 is formed on a surface of the device material, where the recessed portion 7 is formed, by, for example, an electron cyclotron resonance plasma chemical vapor deposition (ECR plasma CVD) method. Next, in the fifth step, a patterning P2 is formed on the dielectric film 8. The patterning P2 has an opening corresponding to a part along the longitudinal direction on a top surface of the protruded portion 4B. Next, in the sixth step, the patterning P2 is removed. In this way, the part along the longitudinal direction on the top surface of the protruded portion 4B is exposed. In this way, patterning for etching that exposes an upper portion of the protruded portion 4B, the etching, and removal of the patterning are performed.

Figure 8A:
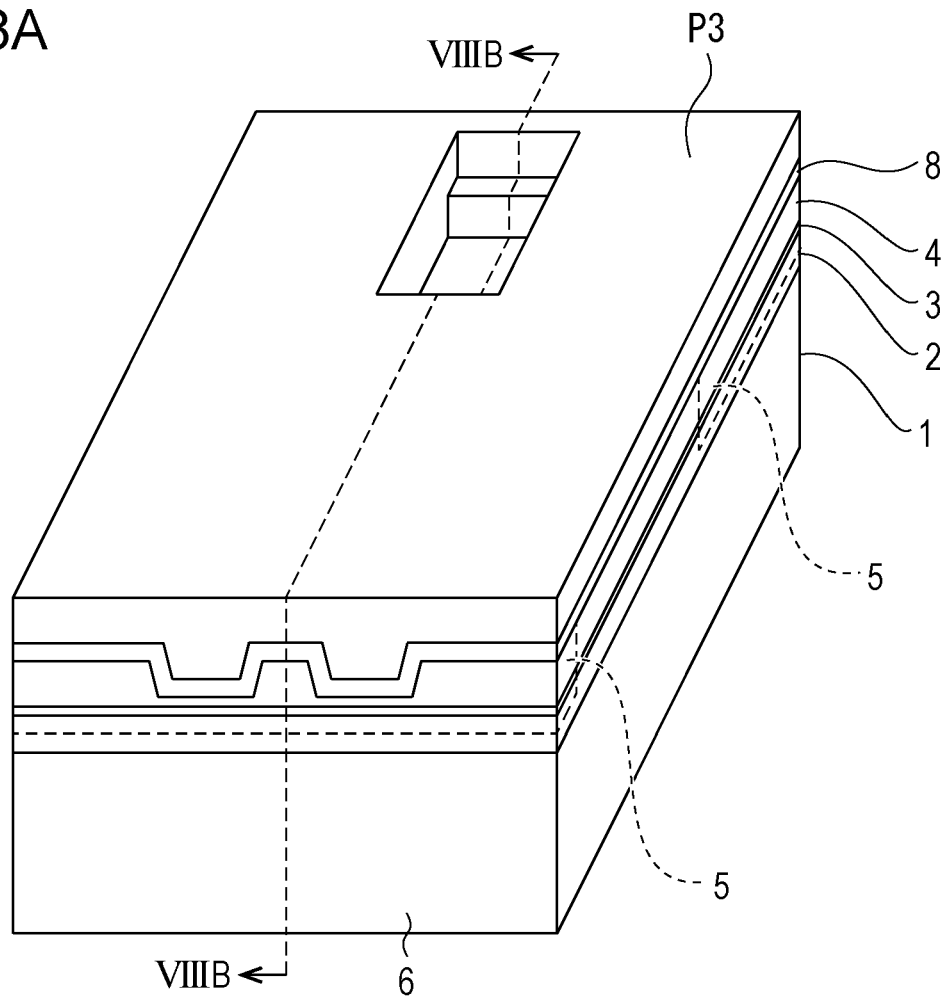
FIG. 8A is a perspective view schematically showing a product of a seventh step in the manufacturing process of the semiconductor laser device according to the embodiment of the present disclosure.
Figure 8B:
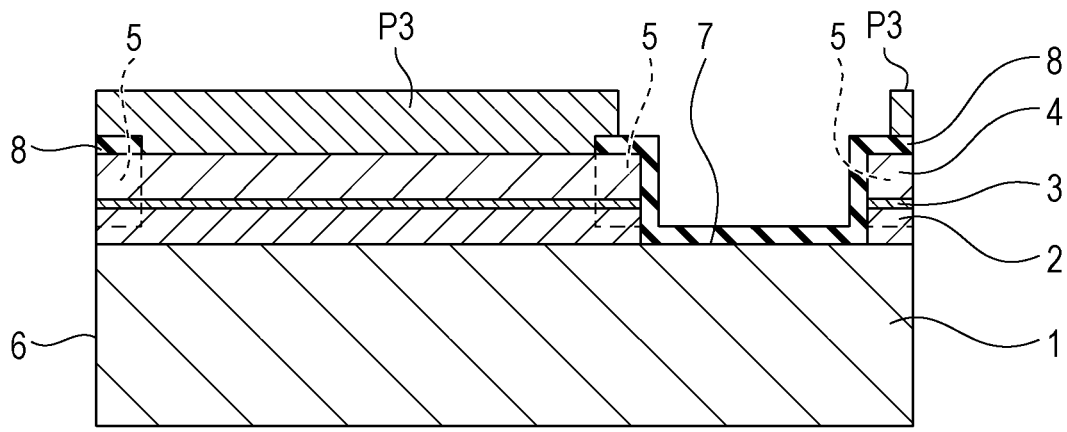
FIG. 8B is a diagram schematically showing a structure of a section of the product taken along line VIIIB-VIIIB in FIG. 8A.
Figure 9A:
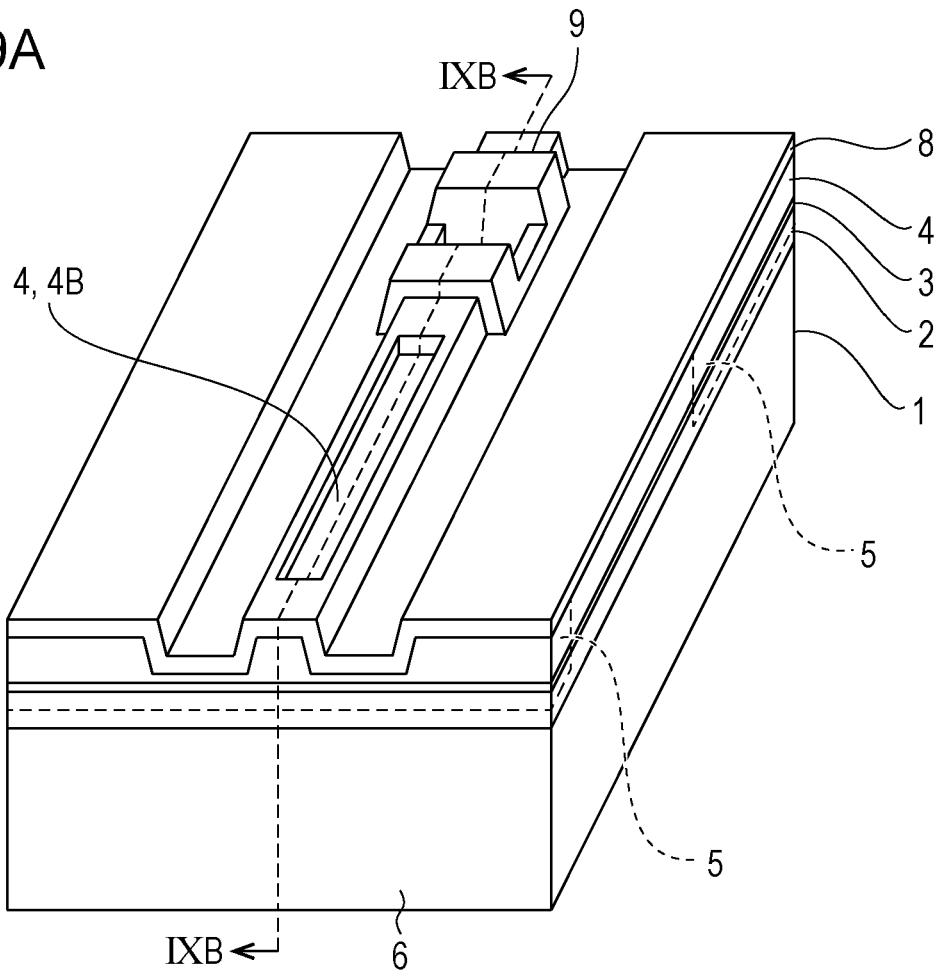
FIG. 9A is a perspective view schematically showing a product of an eighth step in the manufacturing process of the semiconductor laser device according to the embodiment of the present disclosure.
Figure 9B:
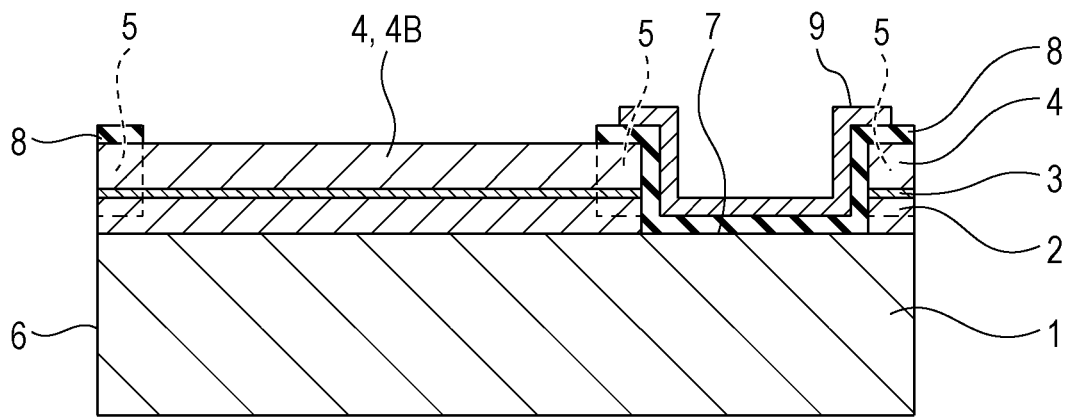
FIG. 9B is a diagram schematically showing a structure of a section of the product taken along line IXB-IXB in FIG. 9A.

The manufacturing method further includes forming the metal film 9 that covers the dielectric film 8. This step can be performed by, for example, a seventh step and an eighth step described below. FIG. 8A As a perspective view schematically showing a product of the seventh step in the manufacturing process of the semiconductor laser device 303. FIG. 8B is a diagram schematically showing a structure of a section of the product taken along line VIIIB-VIIIB in FIG. 8A. FIG. 9A is a perspective view schematically showing a product of the eighth step in the manufacturing process of the semiconductor laser device 303. FIG. 9B is a diagram schematically showing a structure of a section of the product taken along line IXB-IXB in FIG. 9A.

The forming the metal film is, for example, farming the metal film 9 that covers the dielectric film 8 of the recessed portion 7 and covers the peripheral edge portion of the opening of the recessed portion 7. First, in the seventh step, a patterning P3 for forming the metal film 9 is formed on the etched dielectric film 8. The patterning P3 is located on the dielectric film 8 and has an opening having a rectangular shape in plan view. The opening includes the recessed portion 7 and a peripheral edge portion of the recessed portion 7. Next, in the eighth step, the metal film 9 is formed on a surface of device material having the patterning P3 by, for example, vacuum vapor deposition. Then, the patterning P3 is removed. In this way, patterning for forming the metal film 9, film formation, and removal of the patterning are performed.

Figure 10A:
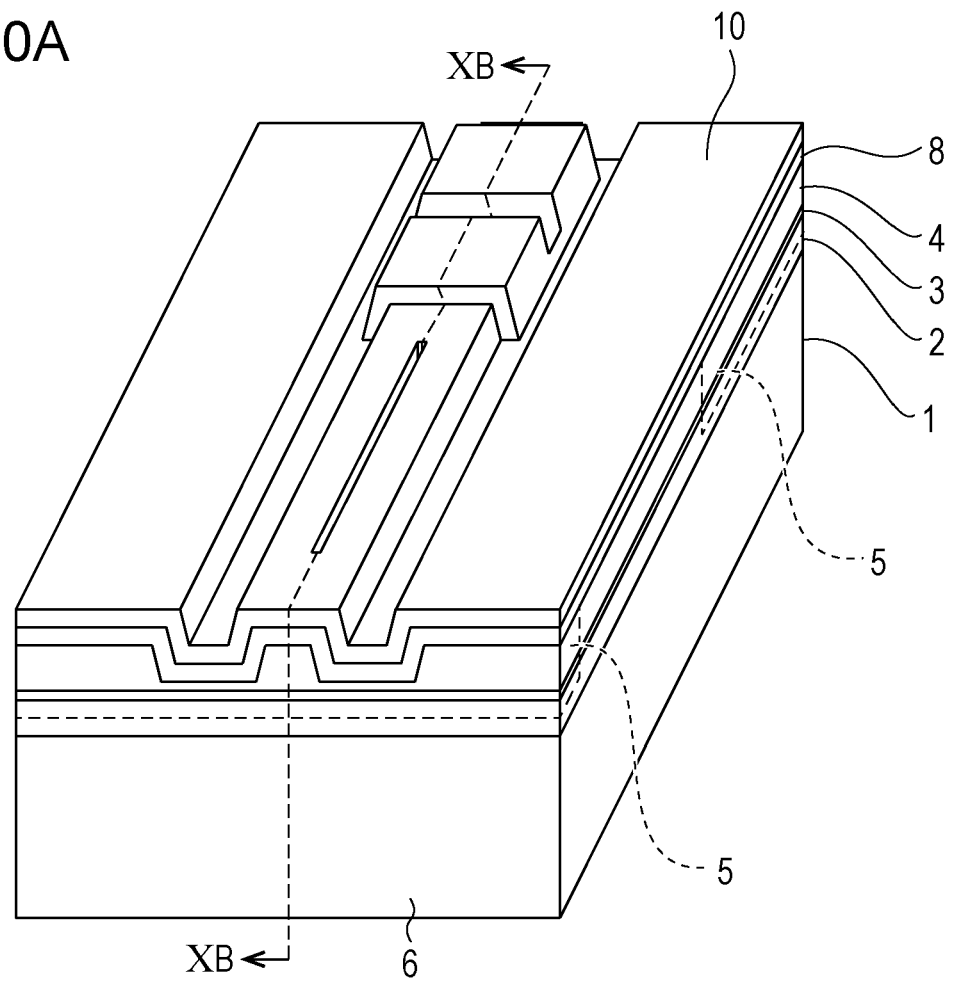
FIG. 10A is a perspective view schematically showing a product of a ninth step in the manufacturing process of the semiconductor laser device according to the embodiment of the present disclosure.
Figure 10B:
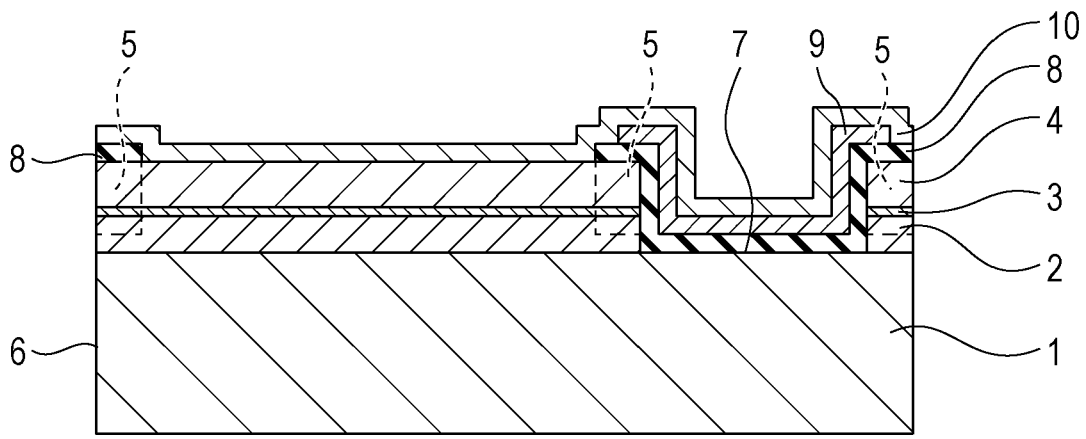
FIG. 10B is a diagram schematically showing a structure of a section of the product taken along line XB-XB in FIG. 10A.

The manufacturing method further includes forming the electrode layer 10 on the second clad layer 4 in the port on to be the optical waveguide. This step canal be performed by, for example, a ninth step described below. FIG. 10A is a perspective view schematically showing a product of the ninth step in the manufacturing process of the semiconductor laser device 303. FIG. 10B is a diagram schematically showing a structure of a section of the product taken along line XB-XB in FIG. 10A.

The forming the electrode layer is, for example, forming a conductive film, which covers the metal film 9 when the semiconductor laser device is seen in plan view, on the metal film 9. In the ninth step, the electrode layer 10 is formed on the device material, where the metal film 9 is formed, by, for example, vacuum vapor deposition. The electrode layer 10a has, for example, a two-layer structure of gold and titanium. First, a gold thin film is formed, and then a titanium thin film is formed, and thus the electrode layer 10 is formed. In this way, the electrode layer 10, which is a p-side electrode and has a function to fix the metal film 9, is formed.

Figure 11A:
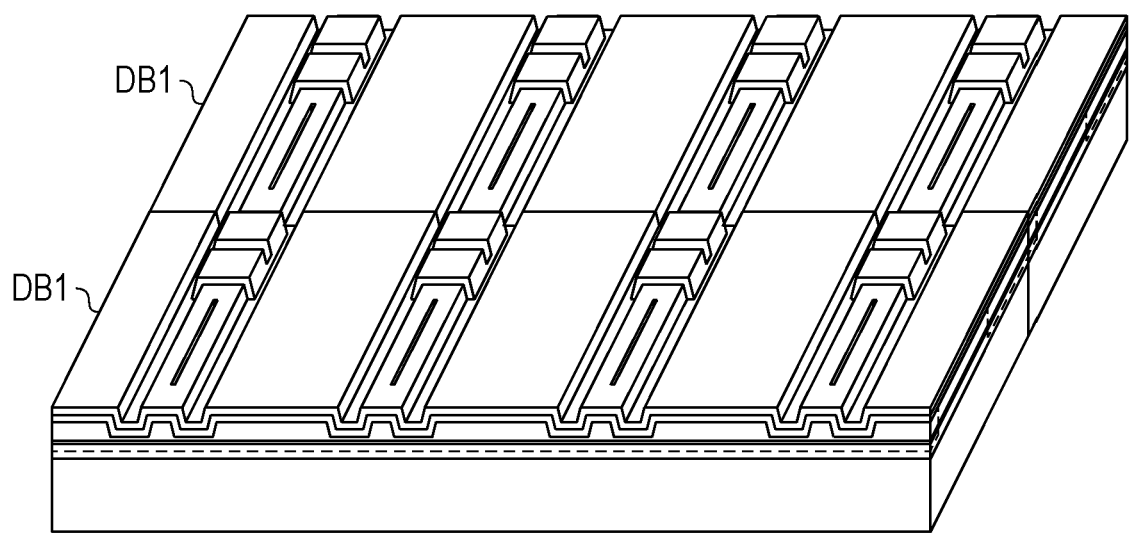
FIG. 11A is a perspective view schematically showing a product provided to a tenth step in the manufacturing process of the semiconductor laser device according to the embodiment of the present disclosure.

The manufacturing method further includes, for example, a step (cleaning step) of cleaning a semiconductor laser device precursor where the electrode layer is formed. The semiconductor laser device precursor is a semifinished product in a manufacturing process of the semiconductor laser device. The semiconductor laser device precursor in the cleaning step may be the device material provided to the step described above, may be a device block which is an aggregate of the device materials, or may be a wafer which is an aggregate of the device blocks. The cleaning step can be performed by, for example, a tenth step described below. FIG. 11A is a perspective view schematically showing a product provided to the tenth step in the manufacturing process of the semiconductor laser device 303. As described above, the device materials are formed on a wafer. The wafer is cleaned by a known method. In this way, the device materials are cleaned in a wafer state. Dust that is generated in the manufacturing process so far and that sticks to the device materials is removed from the device materials by the cleaning.

Figure 11B:
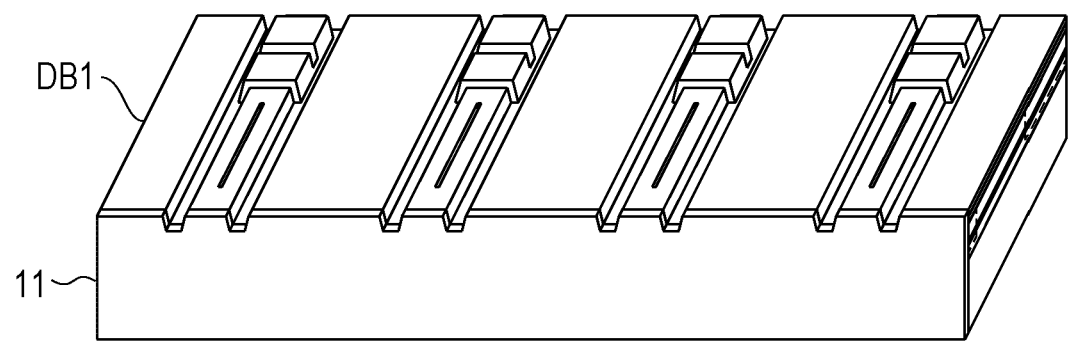
FIG. 11B is a perspective view schematically showing a product provided to an eleventh step in the manufacturing process of the semiconductor laser device according to the embodiment of the present disclosure.

The manufacturing method further includes, for example, forming an end face coat film that covers an end face on the first end side of the semiconductor laser device precursor. The semiconductor laser device precursor in this step may be a semiconductor laser device precursor where the one end face 6 of the semiconductor laser device 303 is formed, may be the device material, or may be the device block. The forming the end face coat film can be performed by, for example, an eleventh step described below. FIG. 11B is a perspective view schematically showing a product of the eleventh step in the manufacturing process of the semiconductor laser device 303. A device block DB1 where a plurality of the device materials continue is cut out from the wafer. The device block DB1 is rectangular and has one surface to be an end face (an emitting surface) of the first end of any device material. In the eleventh step, a dielectric thin film (the end face coat film 11) of $Al_2O_3$ or the like is manufactured by, for example, the ECR plasma CVD described above.

The manufacturing method can further include cutting off the semiconductor laser device 303 from the block (device block) DB1 of the semiconductor laser devices. This step can be performed by, for example, a twelfth step described below. FIG. 12 is a perspective view schematically showing a product of the twelfth step in the manufacturing process of the semiconductor laser device 303. In the twelfth step, the device block DB1 is cut off for each device by a known method. In this way, the semiconductor laser device 303 is obtained.

As described above, the manufacturing method includes forming a structure to be an optical waveguide in the laminated body structure which includes the first clad layer 2, the active layer 3, and the second clad layer 4 in this order on the first surface of the substrate 1, and which is formed by, for example, epitaxial growth. The structure to be the optical waveguide is provided with the window region 5 at a constant width whose wavelength is shorter than a photoluminescence light emitting wavelength of the active layer 3.

Further, the recessed portion 7 is provided by performing etching from a surface side in the window region 5, and a side face on an optical waveguide structure side in the recessed portion 7 is formed into an etched mirror (reflecting surface) substantially perpendicular to the optical waveguide structure. The etched mirror is formed by forming the dielectric film 8 on the side face and forming the metal film 9 on the dielectric film 8. The metal film 9 is formed on the dielectric film 8, and therefore short circuit between the p-side and the n-side due to the metal film 9 in the semiconductor laser device 303 is suppressed.

The other reflecting surface (emitting surface) is formed substantially perpendicular to the optical waveguide by cleaving. Then, a dielectric film (end face coat film 11) is formed on the cleaved mirror. An end face of a main emitting side of the laser light (front surface) is desired to be flat with high degree of accuracy in order to stabilize radiation pattern of the laser. The reflecting surface is formed by etching, and thus the flatness of the reflecting surface may be lower than that of the cleavage surface. It is more preferable to form the emitting surface by cleaving and forming the end face coat film of the dielectric from a viewpoint of controlling the laser into a desired laser light radiation pattern.

The metal film 9 may be patterned. Further, a different kind of metal film (for example, the electrode layer 10 which is a conductive layer having a two-layer structure) may be further formed in addition to the metal film 9. As described above, the metal film 9 is formed from the inside surface of the recessed portion 7 to the peripheral edge portion of the opening of the recessed portion 7. It is preferable that the metal film 9 is arranged so as to wrap around to the upper surface of the semiconductor laser device from the end of the reflecting surface through the opening end edge of the recessed portion 7 as described above. By such an arrangement, the adhesiveness of the metal film 9 to the dielectric film 8 is further improved, and it becomes more difficult for the metal film 9 to be peeled. It is preferable that a metal material of the metal film 9 be gold (Au) whose reflection ratio of laser light is stable.

In the manufacturing method in the embodiment, the semiconductor laser device precursor can be cleaned after the reflecting surface is manufactured, and the end face coat film 11 of the emitting surface can be configured as a single layer. Therefore, when the semiconductor laser device 303 is completed, the semiconductor laser device 303 hardly has dust generated in the manufacturing process. Therefore, regarding the semiconductor laser device 303, contamination due to the dust and degradation of reliability due to the dust are suppressed as compared with semiconductor laser devices of the related art.

[Comparison with Related Art]

Figure 14A:
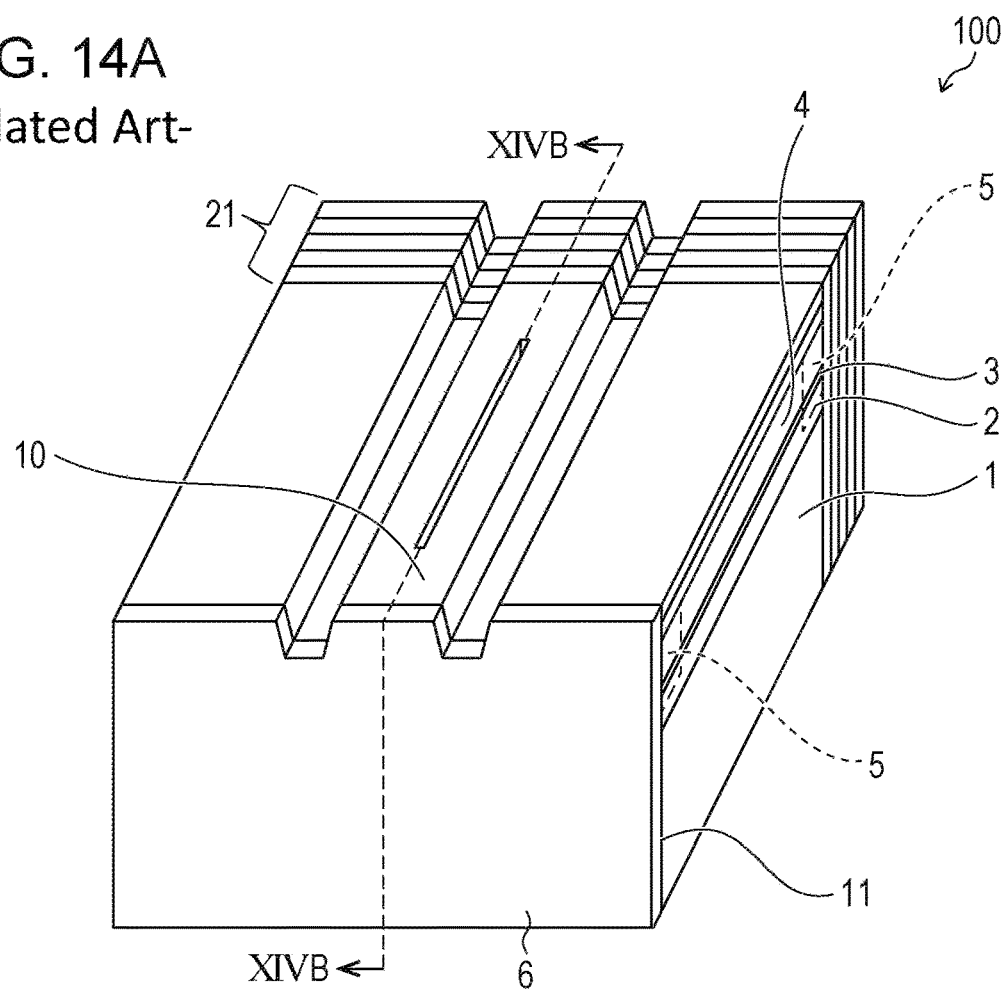
FIG. 14A is a perspective view schematically showing a configuration of an example of a semiconductor laser device of the related art.
Figure 14B:
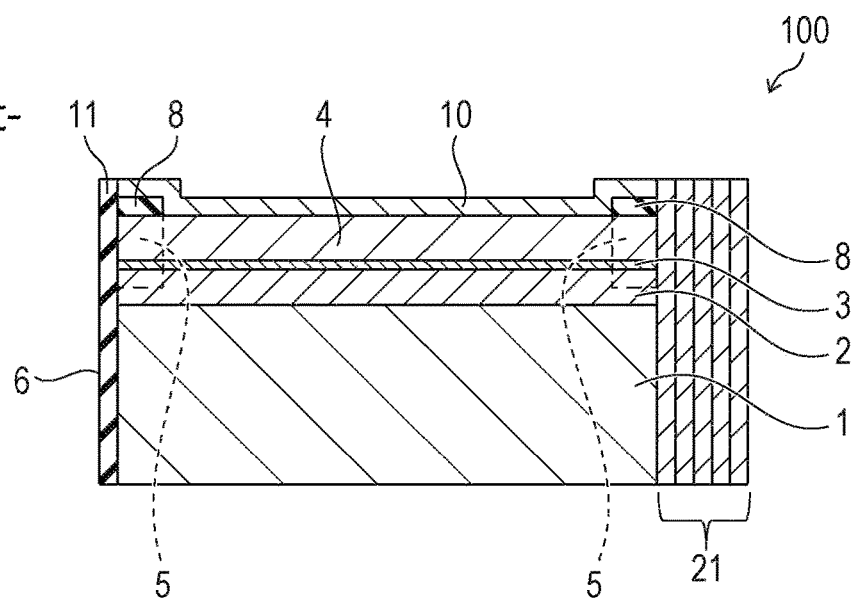
FIG. 14B is a diagram schematically showing a structure of a section of the semiconductor laser device taken along line XIVB-XIVB in FIG. 14A.

Here, a semiconductor laser device of the related art and a manufacturing method thereof will be described. FIG. 14A is a perspective view schematically showing a configuration of an example of a semiconductor laser device of the related art. FIG. 14B is a diagram schematically showing a structure of a section of the semiconductor laser device taken along line XIVB-XIVB in FIG. 14A. As shown in FIG. 14A and FIG. 14B, the semiconductor laser device 100 is different from the semiconductor laser device 303 of the embodiment in that the end face of the second end in the semiconductor laser device is a reflecting surface and the reflecting surface is composed of a laminated body of a plurality of dielectric films.

Specifically, the semiconductor laser device of the related art 100 basically has the substrate 1, the first clad layer 2, the active layer 3, the second clad layer 4, and the electrode layer 10 in this order. The window region 5 is formed at both ends of the optical waveguide in the semiconductor laser device 100, and the dielectric film 8 is arranged between the window region 5 and the electrode layer 10 in the lamination direction. The end face of the first end of the semiconductor laser device 100 is composed of the end face coat film 11 made of dielectric, and the end face of the second end is composed of a dielectric multilayer film 21.

Figure 15A:
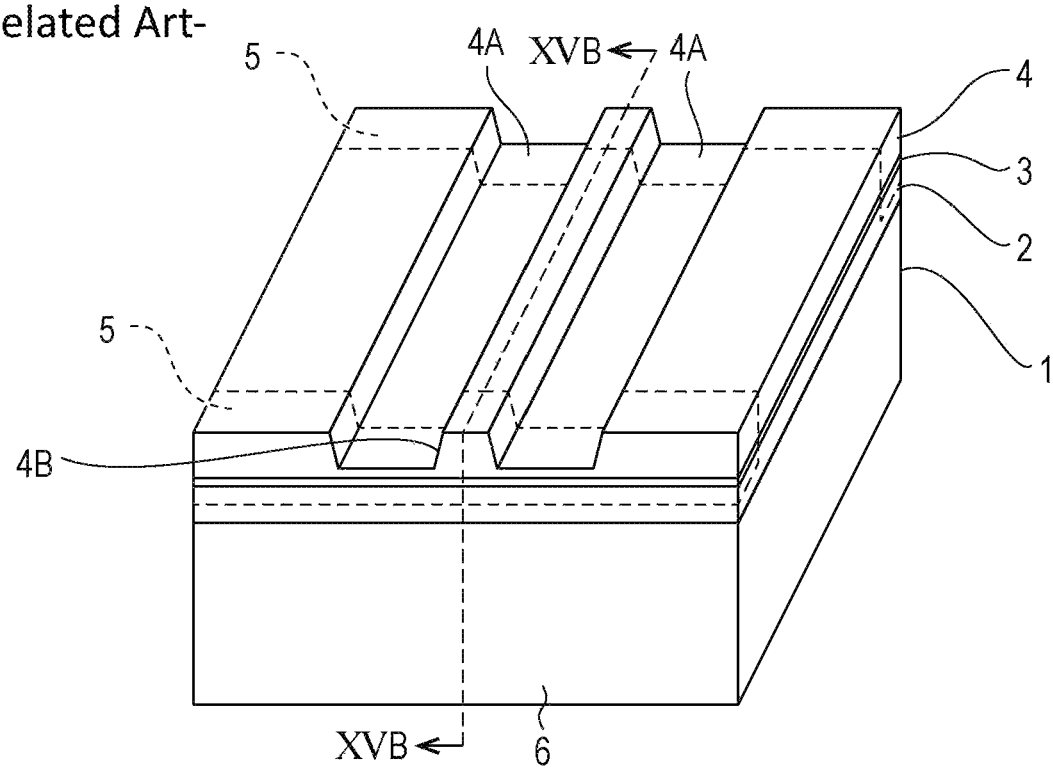
FIG. 15A is a perspective view schematically showing a product of a first step in a manufacturing process of the semiconductor laser device of the related art.
Figure 15B:
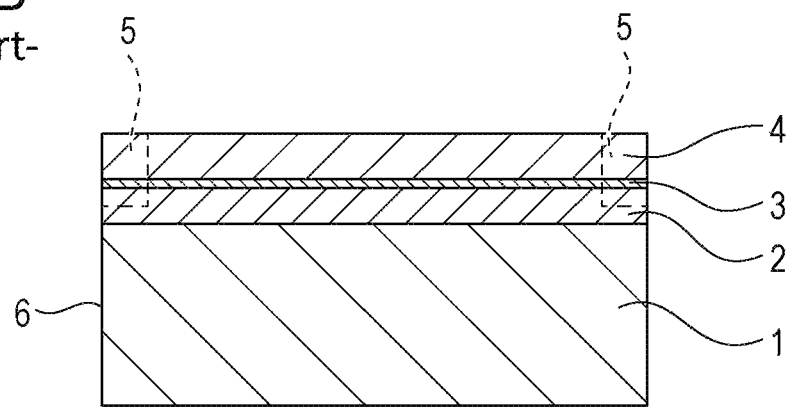
FIG. 15B is a diagram schematically showing a structure of a section of the product taken along line XVB-XVB in FIG. 15A.

The semiconductor laser device 100 can be manufactured by the manufacturing method described below. FIG. 15A is a perspective view schematically showing a product of a first step in a manufacturing process of the semiconductor laser device 100. FIG. 15B is a diagram schematically showing a structure of a section of the product taken along line XVB-XVB in FIG. 15A. In the first step, the air ridge structure is manufactured in the same manner as in the embodiment described above.

Figure 16A:
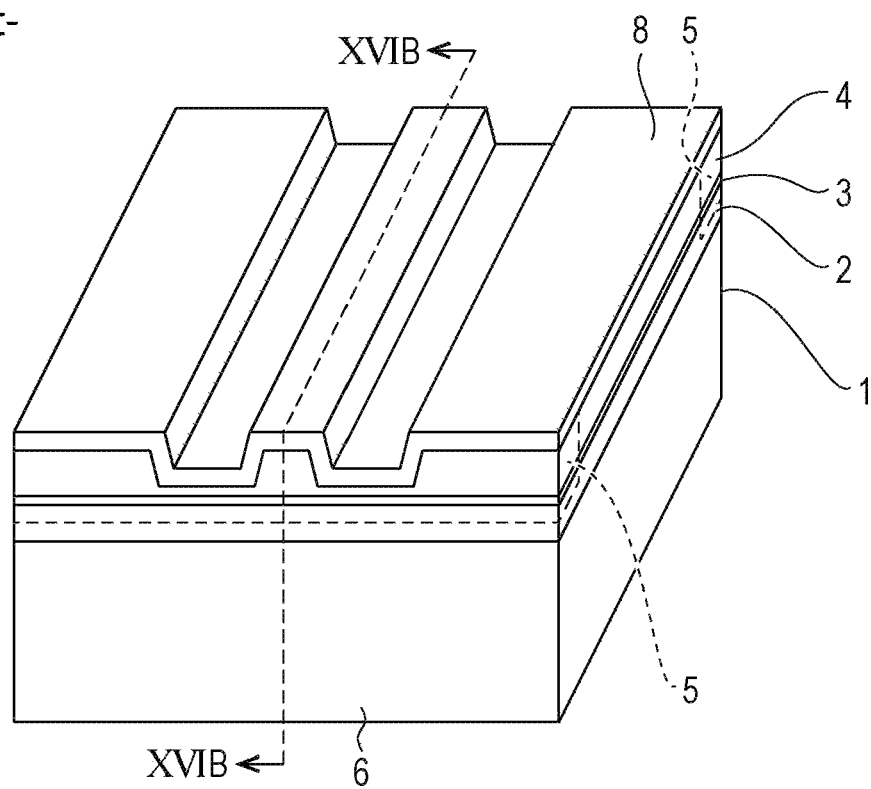
FIG. 16A is a perspective view schematically showing a product of a second step in the manufacturing process of the semiconductor laser device of the related art.
Figure 16B:
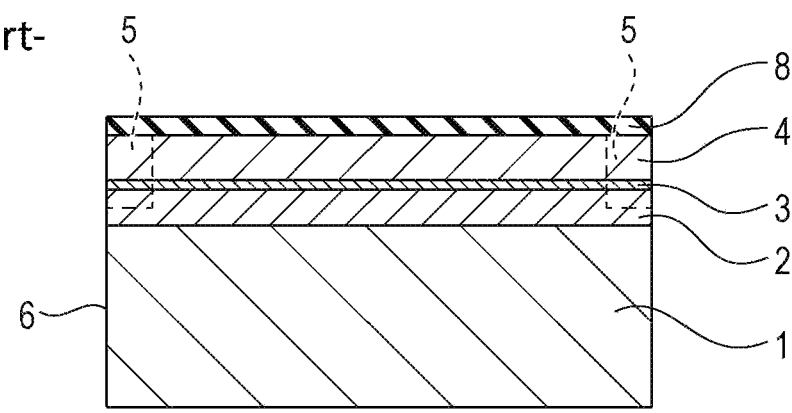
FIG. 16B is a diagram schematically showing a structure of a section of the product taken along line XVIB-XVIB in FIG. 16A.
Figure 17A:
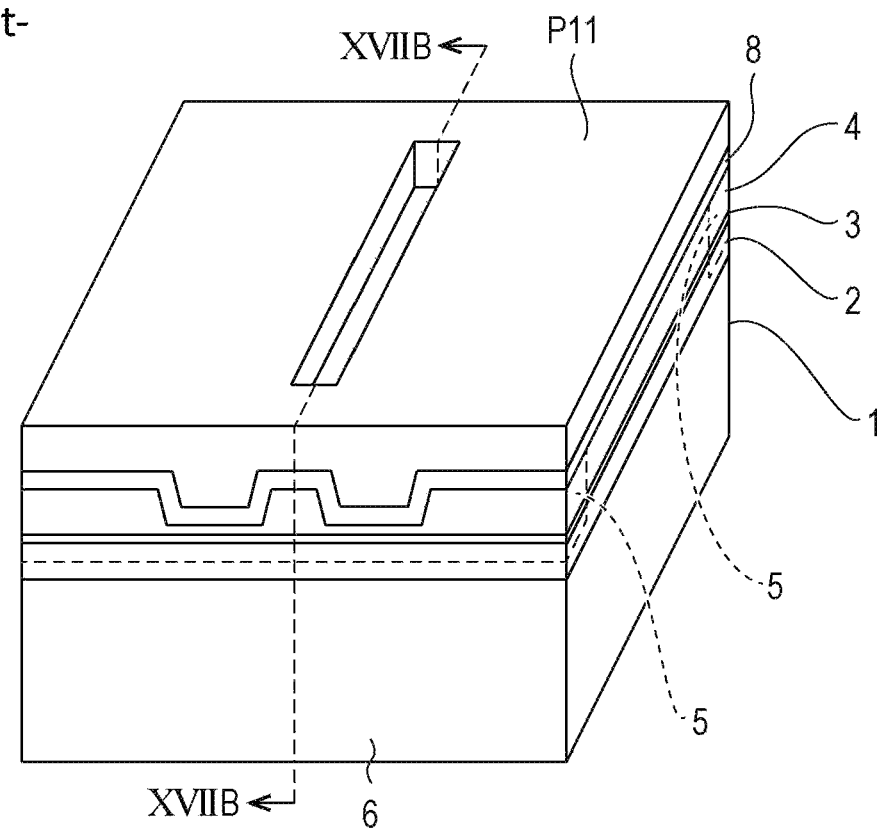
FIG. 17A is a perspective view schematically showing a product of a third step in the manufacturing process of the semiconductor laser device of the related art.
Figure 17B:
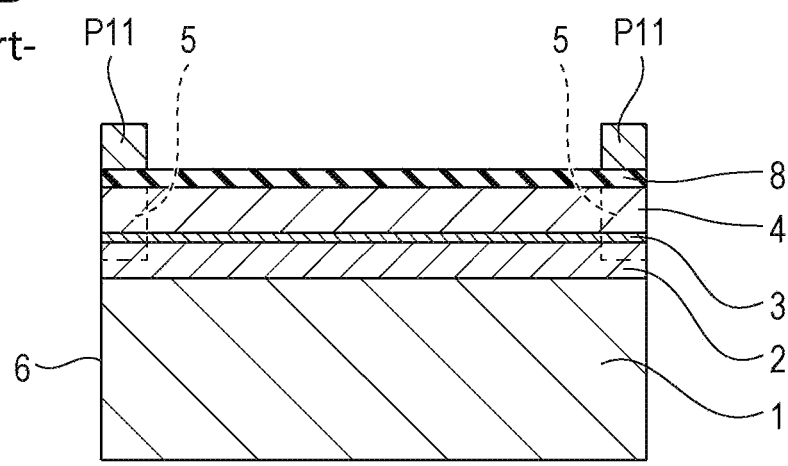
FIG. 17B is a diagram schematically showing a structure of a section of the product taken along line XVIIB-XVIIB in FIG. 17A.
Figure 18A:
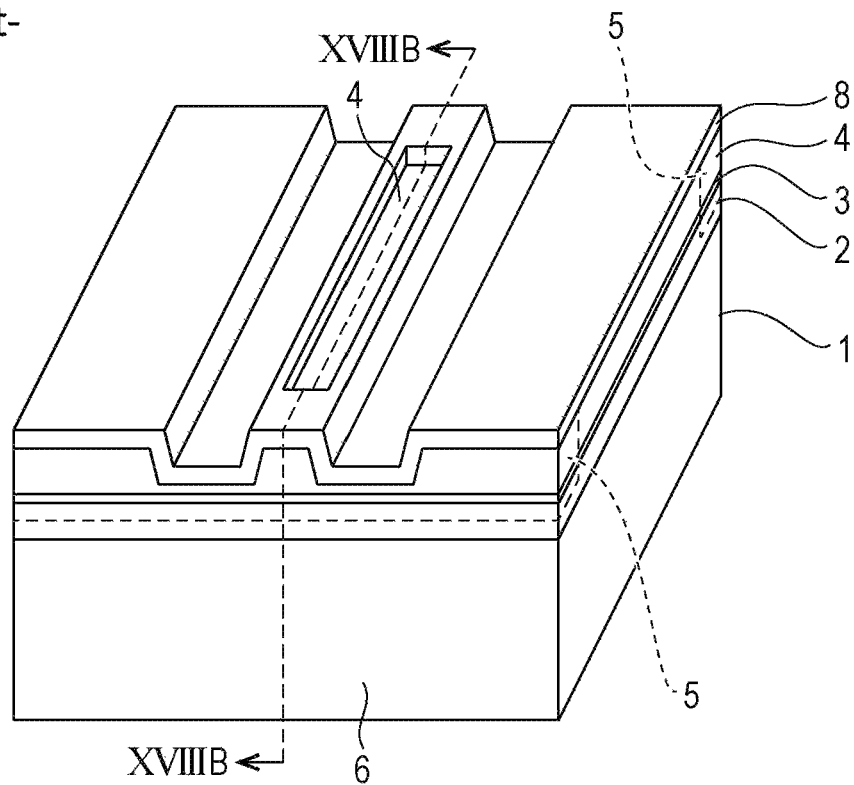
FIG. 18A is a perspective view schematically showing a product of a fourth step in the manufacturing process of the semiconductor laser device of the related art.
Figure 18B:
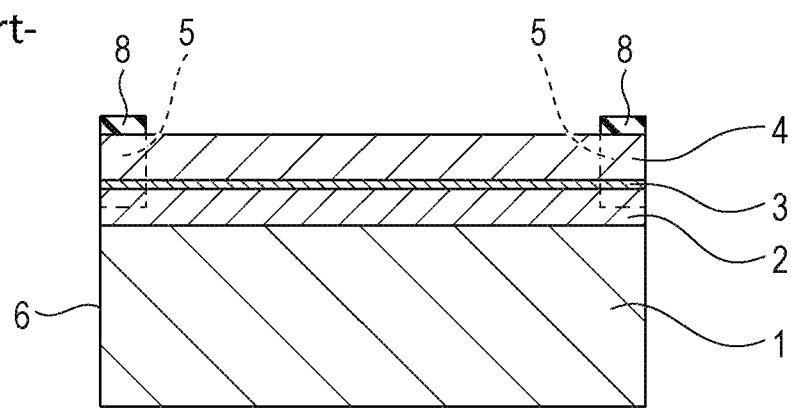
FIG. 18B is a diagram schematically showing a structure of a section of the product taken along line XVIII-XVIII in FIG. 18A.

FIG. 16A is a perspective view schematically showing a product of a second step in the manufacturing process of the semiconductor laser device 100. FIG. 16B is a diagram schematically showing a structure of a section of the product taken along line XVIB-XVIB in FIG. 16A. FIG. 17A is a perspective view schematically showing a product of a third step in the manufacturing process of the semiconductor laser device 100. FIG. 17B is a diagram schematically showing a structure of a section of the product taken along line XVIIB-XVIIB in FIG. 17A. FIG. 18A is a perspective view schematically showing a product of a fourth step in the manufacturing process of the semiconductor laser device 100. FIG. 18B is a diagram schematically showing a structure of a section of the product taken along line XVIII-XVIII in FIG. 18A. Exposing the upper surface of the protruded portion in the air ridge structure is performed similarly to the embodiment described above except that a patterning P11 is used. A method of forming the dielectric film 8 on the exposed second clad layer 4 is the same as that in the embodiment described above.

Figure 19A:
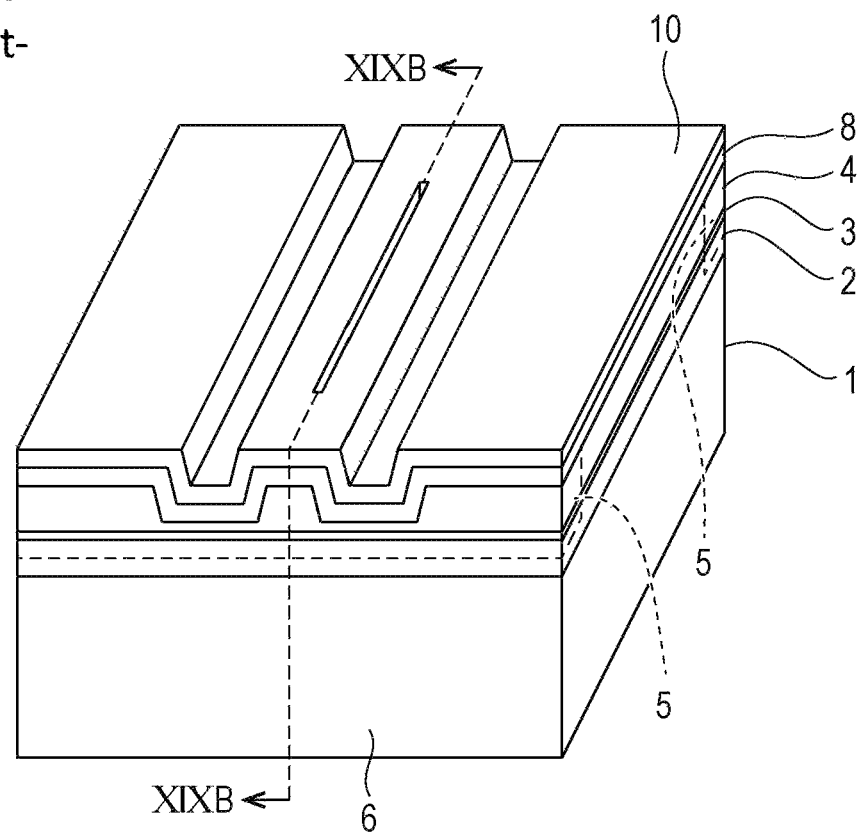
FIG. 19A is a perspective view schematically showing a product of a fifth step in the manufacturing process of the semiconductor laser device of the related art.
Figure 19B:
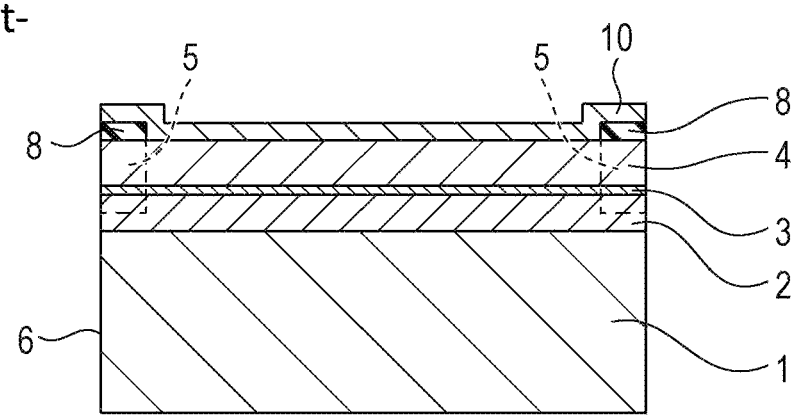
FIG. 19B is a diagram schematically showing a structure of a section of the product taken along line XIXB-XIXB in FIG. 19A.

FIG. 19A is a perspective view schematically showing a product of a fifth step in the manufacturing process of the semiconductor laser device 100. FIG. 19B is a diagram schematically showing a structure of a section of the product taken along line XIXB-XIXB in FIG. 19A. Manufacturing of the electrode layer 10 is the same as that in the in the embodiment described above except that the electrode layer 10 is directly manufactured in the device material where the dielectric film 8 is formed.

Figure 20A:
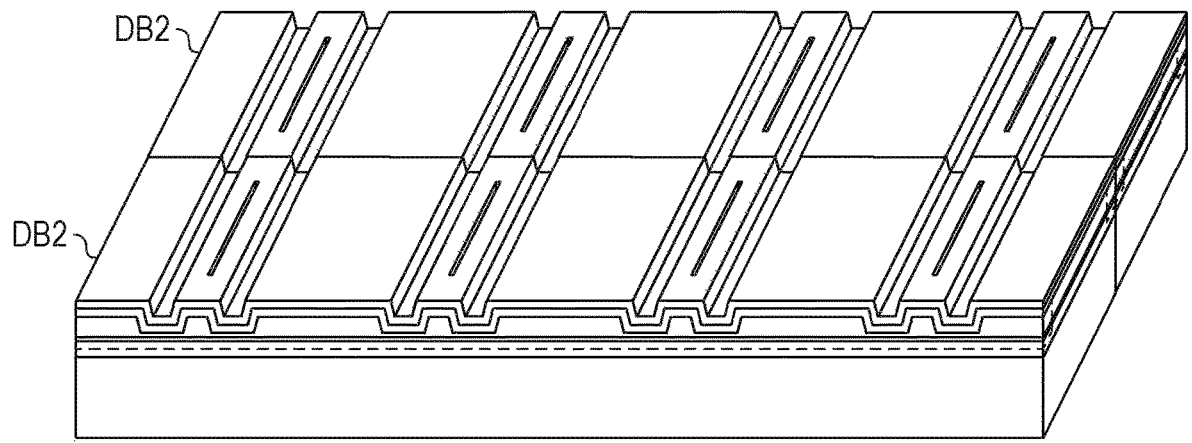
FIG. 20A is a perspective view schematically showing a product provided to a sixth step in the manufacturing process of the semiconductor laser device of the related art.

FIG. 20A is a perspective view schematically showing a product provided to a sixth step in the manufacturing process of the semiconductor laser device 100. In the manufacturing of the semiconductor laser device 100, in the sixth step, the end face coat film 11 made of dielectric is integrally manufactured on the end face (emitting surface) of the first end of the semiconductor laser device 100 in a device block DB2. A manufacturing method of the end face coat film 11 is the same as that in the embodiment described above.

Figure 20B:
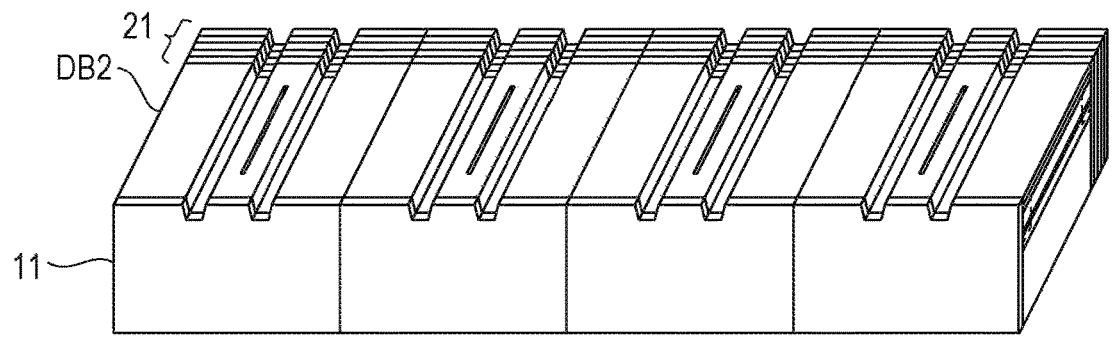
FIG. 20B is a perspective view schematically showing a product of a seventh step in the manufacturing process of the semiconductor laser device of the related art.

FIG. 20B is a perspective view schematically showing a product of a seventh step in the manufacturing process of the semiconductor laser device 100. In the seventh step, a multilayer film of dielectric (dielectric multilayer film 21) is manufactured on the end face of the second end of the semiconductor laser device 100. The dielectric multilayer film 21 is manufactured by laminating a dielectric film a plurality of times.

FIG. 21 is a perspective view schematically showing a product of an eighth step in the manufacturing process of the semiconductor laser device 100. After the dielectric film as described above is formed on both end faces, the semiconductor laser device 100 is cut off from the device block DB2. In this way, the semiconductor laser device 100 is manufactured.

[Explanation of Mechanism for Contamination Suppression]

In the semiconductor laser device of the related art, as described above, both of the front surface (emitting surface) and the rear surface (reflecting surface) are end face coat films formed by, for example, vapor deposition of dielectric. In particular, the rear surface of the semiconductor laser device of the related art is formed by a multi-layered and thick vapor deposition film in order to realize high reflection ratio. The film of the rear surface is multi-layered and thick, and therefore dust easily occurs when the dielectric is peeled off from the film.

Meanwhile, usage environment of a semiconductor laser device mounted on a vehicle is severe. Quality of light source may affect the safety of vehicle occupants. Therefore, quality and reliability of each semiconductor laser device is demanded to be improved.

For example, when dust is attached to the end face of the semiconductor laser device, there is a concern that the performance of the semiconductor laser device is significantly degraded depending on the material of the dust. Therefore, it is important to inhibit dust from attaching to the end face of the semiconductor laser device and to produce a clean semiconductor laser device.

In general, a light-emitting portion in the emitting surface of the semiconductor laser device generates heat when emitting light, and there is an optical tweezers effect. Therefore, it can be considered that the light-emitting portion attracts contamination. It is desired that the semiconductor laser device is kept in a clean condition not only when the semiconductor laser device is manufactured but also when the semiconductor laser device is used. The degradation of the performance is, for example, degradation of the reliability of the semiconductor laser device, that is, variation of laser emission pattern.

Examples of the dust of the semiconductor laser device include dust generated from the end face coat film and dust that is adsorbed to the semiconductor laser device during the manufacturing process. To remove the dust from the semiconductor laser device, ideally, it is desirable to clean the semiconductor laser device after each semiconductor laser device is separated from the wafer. However, it is a large burden to fix each semiconductor laser device on a sheet and clean the semiconductor laser devices in respect of cost and technique. Therefore, it is important to suppress generation of dust first and keep the light-emitting portion in the end face (emitting surface) of the semiconductor laser device in a clean condition.

In the manufacturing of the semiconductor laser device 303 of the embodiment, the end face (emitting surface) on the emitting side of the optical waveguide is composed of the end face coat film 11 formed by vapor deposition of dielectric, and the end face (reflecting surface) opposite the emitting surface of the optical waveguide is composed of a laminated structure of the dielectric film 8 and the metal film 9.

The metal film 9 is located on the surface side of the reflecting surface. Therefore, dust attached during the manufacturing process can be removed from the device block DBI of the semiconductor laser devices by cleaning the semiconductor laser devices 303 before separating the semiconductor laser devices 303 from the wafer or the device block DBI. While the emitting surface is composed of a dielectric film, the reflection ratio of the emitting surface is low and the film thickness of the emitting surface is thin. Therefore, the end face coat film is hardly peeled off. Thus, the semiconductor laser device 303 of the embodiment can significantly reduce dust generated due to the peeling of the film made of dielectric to, for example, one half or less as compared with the semiconductor laser device of the related art 100.

In this way, in the embodiment, it is possible to reduce the dust generated due to the peeling of the film to one half or less, and further it is possible to clean the semiconductor laser devices in a state of a wafer or a device block in the manufacturing process of the semiconductor laser devices. Accordingly, the dust can be reduced.

The reduction of the dust can reduce adsorption of dust onto an end face of blue laser in a composite semiconductor laser device where a plurality of colors of lasers, for example, a red laser and a blue laser, are arranged in the same semiconductor laser device. Therefore, it is possible to produce and use the semiconductor laser device as a high performance RGB device for a display or a projector.

As described above, dust generated from the semiconductor laser device to be mounted on a vehicle may significantly affect electronic components around the semiconductor laser device. Therefore, reduction of the dust is important. The semiconductor laser device of the embodiment can suppress generation of dust, and thus the semiconductor laser device is desirable as a semiconductor laser device to be mounted on a vehicle.

As described above, in the manufacturing of the semiconductor laser device of the embodiment, it is possible to reduce the number of times of coating the end face to one half or less as compared with that in the manufacturing of the semiconductor laser device of the related art. Therefore, the contamination due to attachment of dielectric during vapor deposition is reduced.

In the manufacturing of the semiconductor laser device of the related art, while the dielectric film is formed by vapor deposition on the end face of the first end of the device material, oxidation may progress on the end face of the second end which is unattended. By this oxidation, for example, film forming properties on the end face of the second end, may be degraded and the peeling of the film may be generated, and therefore the reliability of the semiconductor laser device may be degraded. However, in the embodiment, the end face coat film, which is a single-layer dielectric film, is formed on the end face of the first end of the semiconductor laser device, and a dielectric film need not to be formed on the end face of the second end.

In this way, in the embodiment, the number of times of film formation by vapor deposition of dielectric on the end face is reduced by half, and oxidation on the end face on which a dielectric film is to be formed is suppressed. Thus, according to the embodiment, regarding film formation on the end faces, the film formation needs to be performed only once on the end face of the first end, and thus it is expected to reduce material and man-hour for the film formation.

The semiconductor laser device of the embodiment can be used for a light emitting device such as a frame laser, which has the semiconductor laser device.

[Light Emitting Device]

Figure 13:
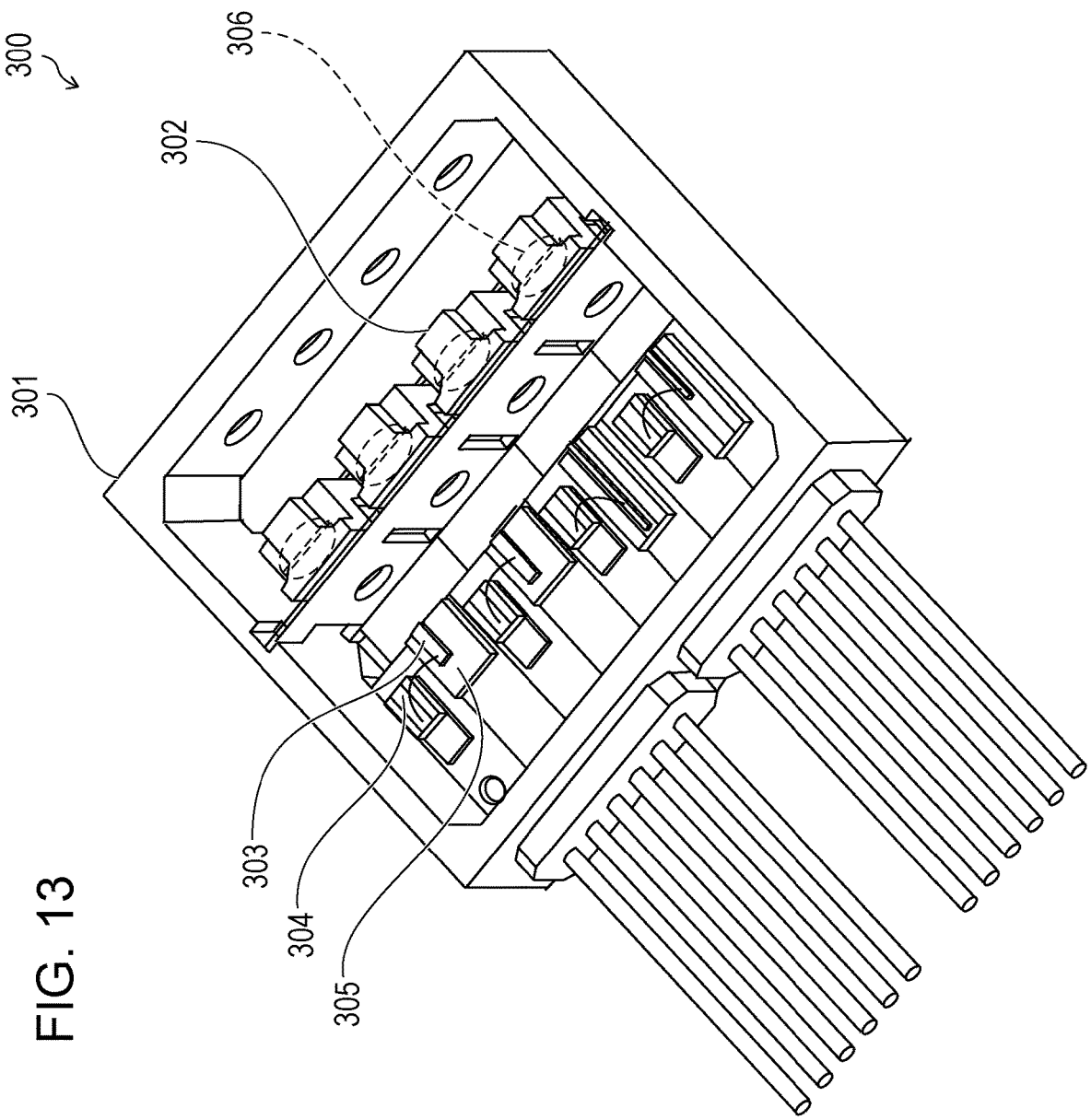
FIG. 13 is a perspective view schematically showing a structure of a light emitting device according to an embodiment of the present disclosure.

FIG. 13 is a perspective view schematically showing a structure of a light emitting device according to an embodiment of the present disclosure as shown in FIG. 13, a frame laser (light emitting device) 300 has a laser package 301, a collimator lens holder 302, the semiconductor laser device 303, a stem 304, a sub-mount 305, and a collimator lens 306.

The laser package 301 is a housing for storing the semiconductor laser device 303 and the other optical components. The collimator lens holder 302 is an instrument having a hole or a slit for controlling luminous flux of laser light emitted from the semiconductor laser device 303 in a desired direction. The stem 304 is a pad of wire. The step 304 is electrically connected to the semiconductor laser device 303 through the wire. The sub-mount 305 is a base portion that supports the semiconductor laser device 303. The sub-mount 305 is composed of, for example, a dielectric. The semiconductor laser device 303 is bonded to the sub-mount 305 with an adhesive such as AuSn at a position of so-called junction down while the protruded portion 4B faces the sub-mount 305. The collimator lens 306 is arranged on an optical path of the laser light oscillated from the semiconductor laser device 303.

In this way, the frame laser 300 is configured in the same manner as a known frame laser except that the semiconductor laser device of the embodiment described above is used for the semiconductor laser device of the frame laser 300.

As obvious from the above description, the semiconductor laser device 303 has a structure having the same height as that of a portion corresponding to the optical waveguide in the protruded portion 4B (in particular, the portion is referred to as a "front protruded portion") around the front protruded portion. Specifically, the semiconductor laser device 303 has a structure whose height is the same as that of the front protruded portion (for example, a wall opposite to the protruded portion 4B in the groove 4A) and a structure whose height is the higher than that of the front protruded portion (for example, a portion of the protruded portion 4B closer to the second end side than the recessed portion 7 (in particular, the portion is referred to as a "rear protruded portion")). Therefore, when the semiconductor laser device 303 is mounted on the sub-mount 305 by function down, a stress applied to the front protruded portion is diffused to the structure described above. Therefore, according to the above arrangement of the semiconductor laser device 303 in the frame laser 300, it is expected to reduce damage to the front protruded portion corresponding to the optical waveguide.

The length (the length in the longitudinal direction of the semiconductor laser device 303) of the rear protruded portion is preferable to be sufficiently long so that the wafer can be cut into device blocks and is preferable to be as short as possible from a viewpoint of utilization efficiency of the wafer. From such a viewpoint, the length of the rear protruded portion is preferable to be, for example, 10 to 15 μm.

The length (the length in the longitudinal direction of the semiconductor laser device 303) of the recessed portion 7 is preferable to be sufficiently long so that the dielectric film 8 and the metal film 9 can be formed and is preferable to be as short as possible from a viewpoint of utilization efficiency of the wafer. From such a viewpoint, the length of the recessed portion 7 is preferable to be, for example, 5 to 20 μm as described above.

In the frame laser 300, more specifically, the semiconductor laser device 303 may be an device for red laser. In this case, regarding materials for each component, the substrate 1 may be GaAs, the first clad layer 2 and the second clad layer 4 may be AlGaInP, the active layer 3 may be InGaAs, and the window region 5 may be provided to both end portions of the optical waveguide. The dielectric film 8 may be $SiO_2$, the metal film 9 may be Au, the electrode layer 10 may be a laminated body of Ti/Au, and the end face coat film 11 may be $Al_2O_3$. The reflection ratio of the red laser light (wavelength is about 830 nm) at the one end face 6 of the semiconductor laser device 303 is 5% or less. The frame laser 300 having the above configuration is applied to, for example, a sensor for automatic driving of a vehicle.

[Modified Example]

The semiconductor laser device and the light emitting device according to the embodiment of the present disclosure may further include other components or may replace some components with other components within a range where the effects of the embodiment described above can be obtained.

For example, the semiconductor laser device described above may further include a conductive film arranged on the metal film. The conductive film may double as an electrode layer as described above or may be formed separately from the electrode layer. In the same manner as the electrode layer, the conductive film may also have an adhesion layer and a protective layer in this order and the materials of the protective layer may be at least one material selected from a group including Ti, W, Ta, Nb, Ni, and Pt.

The electrode layer is not limited to a laminated structure of the adhesion layer and the protective layer, but may be, for example, a single layer of metal.

The reflecting surface describe above need not be the side face on the first end side of the recessed portion if the reflecting surface is a surface crossing at least the active layer. For example, the reflecting surface may be a wall surface of a through hole formed in the device material.

The recessed portion may have a depth where at least the active layer is exposed when the recessed portion is formed. For example, the recessed portion may have a depth from the second clad layer to the surface of the first clad layer. In this way, the recessed portion may have a depth from the second clad layer to an arbitrary position between the surface of the first clad layer and the substrate.

In the manufacturing of the semiconductor laser device, an object to be cleaned in the cleaning step is not limited to the wafer where the electrode layer 10 has been formed but the cleaning can be performed at any timing when the dust generated in the manufacturing process can be removed. For example, the object to be cleaned in the cleaning step may be a device block separated from the wafer. In this case, the cleaning step may be performed before the end face coat film is formed or may be performed after the end face coat film is formed.

The manufacturing method of the semiconductor laser device of the embodiment may further include other steps other than the steps described above within a range where the effects of the embodiment described above can be obtained. For example, the manufacturing method described above may further include forming a laminated body structure including the first clad layer, the active layer, and the second clad layer in this order on the first surface of the substrate by, for example, epitaxial growth.

The manufacturing method described above may further include forming an n-side electrode layer on the first clad layer side, for example, on a surface of the first clad layer opposite to the substrate at an arbitrary period of time. Examples of materials of the n-side electrode layer include gold, tin, and alloy of these.

In the light emitting device (frame laser), the semiconductor laser device is arranged on the sub-mount at a position of junction down. However, the semiconductor laser device may be arranged at a position of junction up.

[Conclusion]

The semiconductor laser device 303 according to an aspect 1 of the present disclosure is the semiconductor laser device 303 including the first clad layer 2, the active layer 3, the second clad layer 4, and the electrode layer 10 in this order. The semiconductor laser device 303 has an optical waveguide that extends from inside of the end face of the second end of the semiconductor laser device 303 toward the end face of the first end (one end face 6) of the semiconductor laser device 303 and a reflecting surface which is arranged at an end on a second end side of the optical waveguide and which crosses the active layer 3. The reflecting surface has the dielectric film and the metal film 9 in this order from the active layer 3.

According to the configuration described above, the reflecting surface is formed besides the end face of the semiconductor laser device 303. Therefore, a reflecting surface made of multi-layered dielectric film at the end face is not required. Further, the reflecting surface can be formed before the film formation of the end face, so that adhesion of dust due to the film formation of the end face is suppressed. Therefore, according to the configuration described above, in the semiconductor laser device 303, it is possible to realize high reliability capable of sufficiently suppressing the contamination caused from the manufacturing process.

In the aspect 1, in the semiconductor laser device 303 according to an aspect 2 of the present disclosure, the metal film 9 may extend from the reflecting surface to over a part of the second clad layer 4 when the semiconductor laser device 303 is seen in plan view.

According to the configuration described above, the metal film 9 is more easily locked to the semiconductor laser device 303. Therefore, the configuration described above is more effective from a viewpoint of improving the adhesiveness of the metal film 9 to the dielectric film 8.

In the aspect 1 or 2, the semiconductor laser device 303 according to an aspect 3 of the present disclosure further includes the recessed portion 7 inside the end face of the second end and the reflecting surface may be the side face on a first end side of the semiconductor laser device 303 in the recessed portion 7

According to the configuration described above, the reflecting surface can be more easily and accurately manufactured by a known method such as etching.

In the aspect 3, in the semiconductor laser device 303 according to an aspect 4 of the present disclosure, when the semiconductor laser device 303 is seen in plan view, the metal film 9 may extend to a position between the reflecting surface in the second clad layer 4 or the recessed portion 7 and an outer edge of the semiconductor laser device 303.

The configuration described above is more effective from a viewpoint of suppressing short circuit due to the metal film 9 and improving the adhesiveness of the metal film 9 to the dielectric film 8.

In the aspect 3 or 4, in the semiconductor laser device 303 according to an aspect 5 of the present disclosure, the recessed portion 7 may have a depth from the second clad layer 4 to at least the first clad layer 2

According to the configuration described above, the reflecting surface surely crosses the active layer 3 in a depth direction of the recessed portion 7. Further, from the second clad layer 4 to the first clad layer 2, normally, the recessed portion 7 can be formed by the same method or condition. Therefore, according to the configuration described above, the recessed portion 7 can be formed more reliably and simply.

In any one of the aspects 1 to 5, in the semiconductor laser device 303 according to an aspect 6 of the present disclosure, the one end face 6 may be a cleavage surface.

According to the configuration described above, the reflection ratio of the emitting surface can be more easily controlled.

In any one of the aspects 1 to 6, the semiconductor laser device 303 according to an aspect 7 of the present disclosure may further include a dielectric film (the end face coat film 11 made of dielectric) that covers the one end face 6.

According to the configuration described above, the reflection ratio at the emitting surface of the optical waveguide canal be more easily controlled.

In any one of the aspects 1 to 7, the semiconductor laser device 303 according to an aspect 8 of the present disclosure may further include the window region 5, which absorbs less laser light than a central portion of the optical waveguide, at both end portions of the optical waveguide.

According to the configuration described above, melting of the active layer 3 due to emission of the laser is suppressed, so that it is possible to further improve durability and reliability of the semiconductor laser device 303.

In any one of the aspects 1 to 8, in the semiconductor laser device 303 according to an aspect 9 of the present disclosure, the electrode layer 10 may be arranged on the metal film 9.

According to the configuration described above, it is possible to further improve adhesiveness of the metal film 9 and the electrode layer 10.

In the aspect 9, in the semiconductor laser device 303 according to an aspect 10 of the present disclosure, the electrode layer 10 includes an adhesion layer and a protective layer in this order from the metal film 9, and a material of the protective layer may be at least one selected from a group including Ti, W, Ta, Nb, Ni, and Pt.

According to the configuration described above, it is possible to furthermore improve adhesiveness between the metal film 9 and the electrode layer 10 and durability of the electrode layer 10.

In any one of the aspects 1 to 10, in the semiconductor laser device 303 according to an aspect 11 of the present disclosure, a metal of the metal film 9 may be at least one selected from a group including Au, Al, and Ag.

According to the configuration described above, it is possible to furthermore improve stability of the reflection ratio on the reflecting surface.

A manufacturing method of the semiconductor laser device 303 according to an aspect 12 of the present disclosure includes forming a portion to be an optical waveguide extending from the first end to the second end of the substrate 1 in the second clad layer 4 of a device material having the first clad layer 2, the active layer 3, and the second clad layer 4 in this order on the substrate 1, forming the recessed portion 7 which opens in the second clad layer 4 and crosses the active layer 3 in an end portion on a second end side in the portion to be the optical waveguide, forming the dielectric film 8 that covers a portion where the active layer 3 on a first end side in a side face of the recessed portion 7 is exposed, forming the metal film 9 that covers the dielectric film 8, and forming the electrode layer 10 on the second clad layer 4 in the portion to be the optical waveguide.

According to the configuration described above, a reflecting surface is formed in the recessed portion 7, so that it is not necessary to form a reflecting surface on the end face of the second end in the semiconductor laser device 303. Further, the reflecting surface is formed in the recessed portion 7, so that dust caused by film formation on the end face is hardly attached to the reflecting surface. Therefore, according to the configuration described above, it is possible to manufacture the semiconductor laser device 303 having high reliability capable of sufficiently suppressing the contamination caused from the manufacturing process.

In the aspect 12, in the manufacturing method of the semiconductor laser device 303 according to an aspect 13 of the present disclosure, the device material may further include the window region 5, which absorbs less laser light than a central portion of the optical waveguide, at both end portions of a portion to be the optical waveguide.

According to the configuration described above, melting of the active layer 3 due to emission of the laser is further suppressed. Therefore, it is possible to manufacture the semiconductor laser device 303 having higher durability and reliability.

In the aspect 12 or 13, in the manufacturing method of the semiconductor laser device 303 according to an aspect 14 of the present disclosure, the forming the dielectric film 8 may be forming the dielectric film 8 that covers the surface of the recessed portion 7, and the forming the metal film 9 may be forming the metal film 9 that covers the dielectric film 8 of the recessed portion 7 and that covers the peripheral edge portion of the opening of the recessed portion 7.

According to the configuration described above, it is possible to manufacture the metal film 9 having higher adhesiveness to the semiconductor laser device 303 and more easily manufacture a reflecting surface that can suppress short circuit due to the metal film 9 in the recessed portion 7.

In any one of the aspects 12 to 14, in the manufacturing method of the semiconductor laser device 303 according to an aspect 15 of the present disclosure, the forming the recessed portion 7 may be forming the recessed portion 7 having a depth from the second clad layer 4 to at least the first clad layer 2.

According to the configuration described above, the recessed portion 7 surely crosses the active layer 3, so that a reflecting surface that crosses the active layer 3 can be more reliably manufactured. Further, according to the configuration described above, the recessed portion 7 reaching from the second clad layer 4 to the first clad layer 2 can be normally formed by the same method or condition, so that the recessed portion 7 can be formed more reliably and simply.

In any one of the aspects 12 to 15, in the manufacturing method of the semiconductor laser device 303 according to an aspect 16 of the present disclosure, the forming the electrode layer 10 may be forming the electrode layer 10 located on the metal film 9.

According to the configuration described above, it is possible to manufacture the semiconductor laser device 303 having higher adhesiveness between the metal film 9 and the electrode layer 10.

In any one of the aspects 12 to 16, the manufacturing method of the semiconductor laser device 303 according to an aspect 17 of the present disclosure may further include forming a dielectric film (the end face coat film 11) that covers one end face 6 of a semiconductor laser device precursor where line electrode layer 10 is formed.

According to the configuration described above, the reflection ratio at the emitting surface of the optical waveguide can be more easily controlled.

In any one of the aspects 12 to 17, the manufacturing method of the semiconductor laser device 303 according to an aspect 18 of the present disclosure may further include cleaning a semiconductor laser device precursor where the electrode layer 10 is formed.

According to the configuration described above, it is possible to remove dust that has stuck to the precursor in the manufacturing process from the precursor. Therefore, it is possible to manufacture the semiconductor laser device 303 having higher reliability.

In any one of the aspects 12 to 18, in the manufacturing method of the semiconductor laser device 303 according to an aspect 19 of the present disclosure, the forming the portion to be the optical waveguide is forming, in the second clad layer 4, two grooves in parallel with each other which extend from the first end to the second end of the substrate 1. The portion to be the optical waveguide may be included in a protruded portion located between the two grooves when the semiconductor laser device 303 is seen in plan view.

According to the configuration described above, it is possible to manufacture the semiconductor laser device 303 where a light emitting position on the emitting surface is more easily controlled and determined. The semiconductor laser device 303 manufactured with the configuration described above is supported by a protruded portion between the grooves and both side portions of the grooves when being mounted while the protruded portion and the grooves are facing a base. Therefore, according to the configuration described above, it is possible to manufacture the semiconductor laser device 303 where the protruded portion further relaxes stress applied to the semiconductor laser device 303.

A light emitting device (frame laser 300) according to an aspect 20 of the present disclosure has the semiconductor laser device 303 of any one of the aspects 1 to 11.

According to the configuration described above, it is possible to realize a light emitting device having higher reliability.

The present disclosure is not limited to the embodiments described above, but can be variously modified within the scope of the claims. An embodiment obtained by appropriately combining technical units disclosed in different embodiments is also included in the technical scope of the present disclosure. Further, it is possible to form novel technical features by combining the technical units disclosed respectively in the embodiments.

The present disclosure contains subject matter related to that disclosed in Japanese Priority Patent Application JP 2018-006496 filed in the Japan Patent Office on Jan. 18, 2018, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor laser device including a first clad layer, an active layer, a second clad layer, and an electrode layer in this order, the semiconductor laser device comprising:
   an optical waveguide that extends from inside of an end face of a second end of the semiconductor laser device toward an end face of a first end of the semiconductor laser device; and
   a reflecting surface which is arranged at an end on a second end side of the optical waveguide and which crosses the active layer,
   wherein the reflecting surface has a dielectric film and a metal film in this order from the active layer, and
   the electrode layer is arranged on the metal film.

2. The semiconductor laser device according to claim 1, wherein the metal film extends from the reflecting surface to over a part of the second clad layer when the semiconductor laser device is seen in plan view.

3. The semiconductor laser device according to claim 1, wherein
   the semiconductor laser device further includes a recessed portion inside the end face of the second end, and
   the reflecting surface is a side face on a first end side in the recessed portion.

4. The semiconductor laser device according to claim 3, wherein when the semiconductor laser device is seen in plan view, the metal film extends to a position between the reflecting surface in the second clad layer or the recessed portion and an outer edge of the semiconductor laser device.

5. The semiconductor laser device according to claim 3, wherein the recessed portion has a depth from the second clad layer to at least the first clad layer.

6. The semiconductor laser device according to claim 1, wherein the end face of the first end is a cleavage surface.

7. The semiconductor laser device according to claim 1, further comprising a dielectric film that covers the end face of the first end.

8. The semiconductor laser device according to claim 1, further comprising a window region, which absorbs less laser light than a central portion of the optical waveguide, at both end portions of the optical waveguide.

9. The semiconductor laser device according to claim 1, wherein the electrode layer includes an adhesion layer and a protective layer in this order from the metal film, and a material of the protective layer is at least one selected from a group including Ti, W, Ta, Nb, Ni, and Pt.

10. The semiconductor laser device according to claim 1, wherein a metal of the metal film is at least one selected from a group including Au, Al, and Ag.

11. A light emitting device comprising the semiconductor laser device according to claim 1.

* * * * *